United States Patent
Hirotani et al.

(10) Patent No.: US 10,249,641 B2
(45) Date of Patent: Apr. 2, 2019

(54) SEMICONDUCTOR MEMORY DEVICE AND METHOD FOR MANUFACTURING SAME

(71) Applicant: Toshiba Memory Corporation, Minato-ku (JP)

(72) Inventors: Takashi Hirotani, Yokkaichi (JP); Minori Kajimoto, Fujisawa (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 111 days.

(21) Appl. No.: 15/258,566

(22) Filed: Sep. 7, 2016

(65) Prior Publication Data

US 2017/0236827 A1    Aug. 17, 2017

Related U.S. Application Data

(60) Provisional application No. 62/296,240, filed on Feb. 17, 2016.

(51) Int. Cl.
*H01L 27/11582* (2017.01)
*H01L 49/02* (2006.01)

(52) U.S. Cl.
CPC ........ *H01L 27/11582* (2013.01); *H01L 28/00* (2013.01)

(58) Field of Classification Search
CPC ............... H01L 27/11582; H01L 27/11578
See application file for complete search history.

(56) References Cited

U.S. PATENT DOCUMENTS

| | | | |
|---|---|---|---|
| 8,198,667 B2 | 6/2012 | Kuniya et al. | |
| 8,426,976 B2 | 4/2013 | Ishiduki et al. | |
| 8,482,049 B2 | 7/2013 | Son et al. | |
| 2011/0303969 A1 | 12/2011 | Kai et al. | |
| 2012/0211822 A1* | 8/2012 | Linn; Se-Yun | H01L 27/11551 257/324 |
| 2014/0308789 A1 | 10/2014 | Kai et al. | |
| 2015/0303215 A1* | 10/2015 | Chang | H01L 21/28273 257/314 |

FOREIGN PATENT DOCUMENTS

| | | |
|---|---|---|
| JP | 2009-224466 | 10/2009 |
| JP | 2012-4249 | 1/2012 |

* cited by examiner

*Primary Examiner* — Marc Anthony Armand
(74) *Attorney, Agent, or Firm* — Oblon, McClelland, Maier & Neustadt, L.L.P.

(57) ABSTRACT

A semiconductor memory device according to one embodiment includes a substrate, a stacked body provided on a first-direction side of the substrate, a semiconductor member extending in the first direction, and a charge storage film provided between the stacked body and the semiconductor member. The stacked body includes first insulating films and electrode films stacked alternately along the first direction. A recess is made in a surface of the stacked body facing the semiconductor member every one of the electrode films.

13 Claims, 23 Drawing Sheets

SEMICONDUCTOR MEMORY DEVICE AND METHOD FOR MANUFACTURING SAME

CROSS-REFERENCE TO RELATED APPLICATIONS

This application is based upon and claims the benefit of priority from U.S. Provisional Patent Application 62/296,240, filed on Feb. 17, 2016; the entire contents of which are incorporated herein by reference.

FIELD

Embodiments relate to a semiconductor memory device and a method for manufacturing the same.

BACKGROUND

In recent years, a stacked type semiconductor memory device has been proposed in which memory cells are integrated three-dimensionally. In such a stacked type semiconductor memory device, a stacked body in which electrode films and insulating films are stacked alternately is provided on a semiconductor substrate; and a semiconductor member that pierces the stacked body is provided. Also, a memory cell is formed at each intersection between the semiconductor member and the electrode films. In such a semiconductor memory device, it is desirable to improve the retention characteristics of the data.

DETAILED DESCRIPTION

A semiconductor memory device according to one embodiment includes a substrate, a stacked body provided on a first-direction side of the substrate, a semiconductor member extending in the first direction, and a charge storage film provided between the stacked body and the semiconductor member. The stacked body includes first insulating films and electrode films. Each of the first insulating films and each of the electrode films are stacked alternately along the first direction. A recess is made in a surface of the stacked body facing the semiconductor member every one of the electrode films.

A semiconductor memory device according to one embodiment includes a stacked body, a semiconductor member and a charge storage film provided between the stacked body and the semiconductor member. The stacked body includes first insulating films and electrode films. Each of the first insulating films and each of the electrode films are stacked alternately along a first direction. The semiconductor member extends in the first direction and pierces the stacked body. A diameter of a portion of the semiconductor member surrounded with one of the electrode films being larger than a diameter of a portion of the semiconductor member surrounded with one of the first insulating films.

A method for manufacturing a semiconductor memory device according to one embodiment includes forming a stacked body. The stacked body includes first insulating films and first films. Each of the first insulating films and each of the first films are stacked alternately. The method includes making a first through-portion in the stacked body, the first through-portion extends in a stacking direction of the first insulating films and the first films. The method includes making first recesses in an inner surface of the first through-portion by removing a portion of each of the first films via the first through-portion. The method includes forming a charge storage film as a continuous film on inner surfaces of the first through-portion and the first recesses. The method includes forming a semiconductor member on the inner surfaces of the first through-portion and the first recesses. The method includes making a second through-portion in the stacked body, the second through-portion extends in the stacking direction. The method includes making second recesses in an inner surface of the second through-portion by removing a remainder of each of the first films via the second through-portion. The method includes forming electrode films inside the second recesses.

(First Embodiment)

First, a first embodiment will be described.

Figure 1:
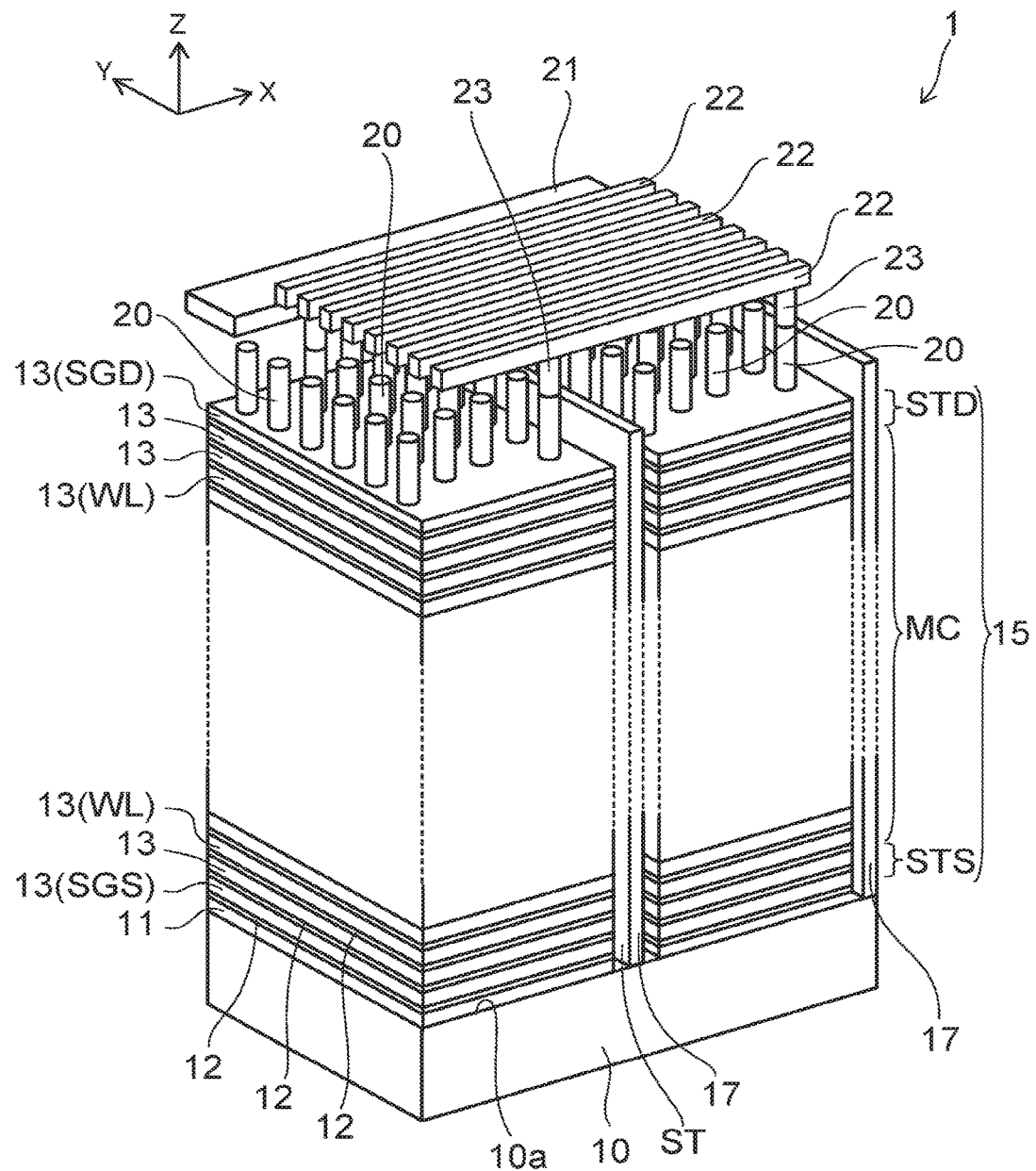
FIG. 1 is a perspective view showing a semiconductor memory device according to a first embodiment.

FIG. 1 is a perspective view showing a semiconductor memory device according to the embodiment.

Figure 2:
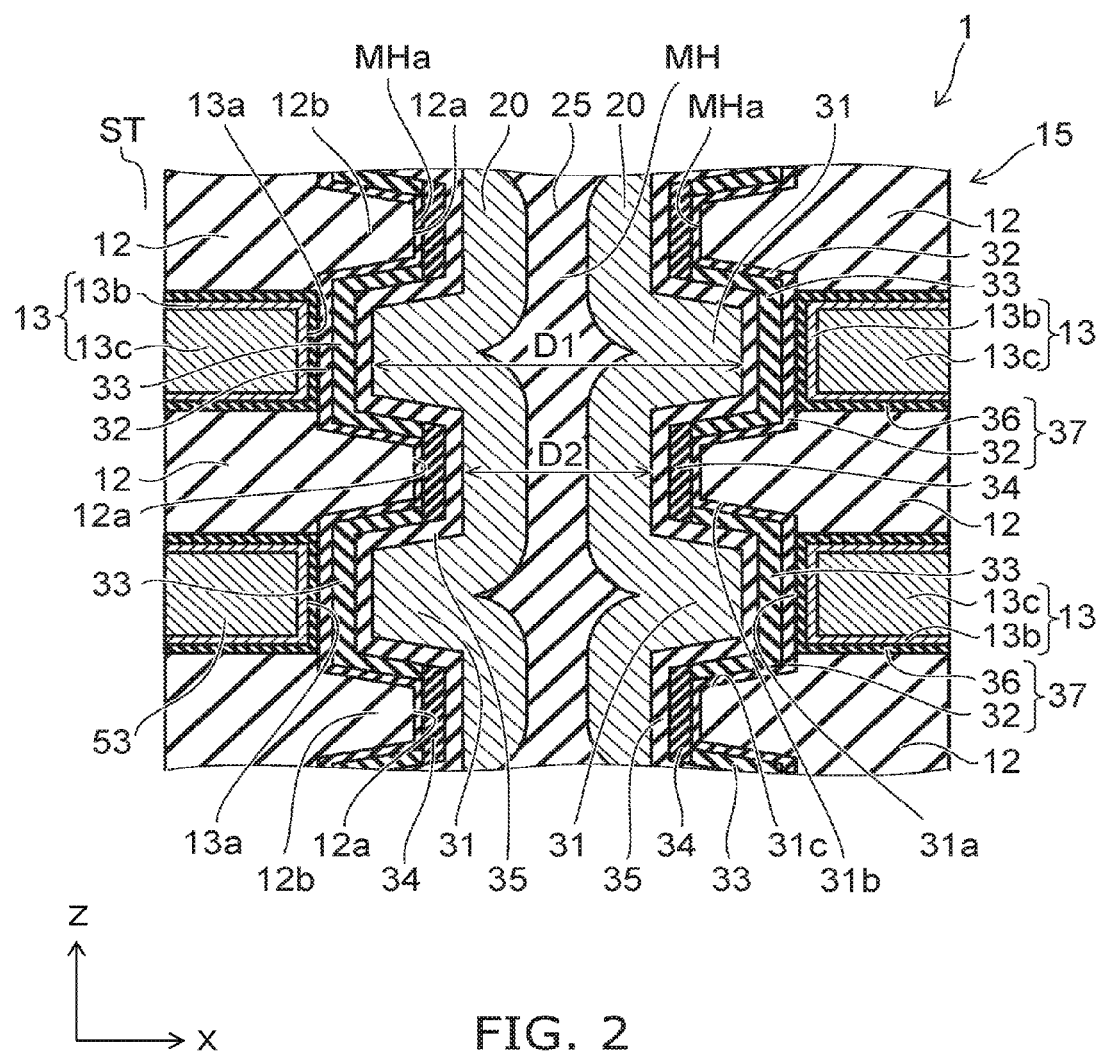
FIG. 2 is a cross-sectional view showing the semiconductor memory device according to the first embodiment.

FIG. 2 is a cross-sectional view showing the semiconductor memory device according to the embodiment.

The semiconductor memory device according to the embodiment is a stacked nonvolatile memory device.

As shown in FIG. 1, a silicon substrate 10 is provided in the semiconductor memory device 1 according to the embodiment.

In the specification hereinbelow, an XYZ orthogonal coordinate system is employed for convenience of description. Two mutually-orthogonal directions parallel to an upper surface 10*a* of the silicon substrate 10 are taken as an "X-direction" and a "Y-direction;" and a direction perpendicular to the upper surface 10*a* of the silicon substrate 10 is taken as a "Z-direction." Also, in the specification, although the direction in which the upper surface 10*a* faces in the Z-direction also is called "up," and the reverse direction also is called "down," this differentiation is for convenience and is independent of the direction of gravity.

A silicon oxide film 11 is provided on the silicon substrate 10. In the specification, "silicon oxide film" refers to a film having silicon oxide (SiO) as a major component. Accordingly, the silicon oxide film 11 includes silicon (Si) and oxygen (O). Also, because silicon oxide generally is an insulating material, the silicon oxide film is an insulating film unless otherwise indicated. This is similar for the other constituents as well; and in the case where the material name is included in the name of the constituent, the material is a major component of the constituent.

A silicon oxide film 12 and an electrode film 13 are stacked alternately along the Z-direction on the silicon oxide film 11. A stacked body 15 is formed of the silicon oxide film 11, and of the multiple silicon oxide films 12 and the multiple electrode films 13 that are stacked alternately.

Multiple source electrode plates 17 are provided inside the stacked body 15. The configuration of the source electrode plate 17 is a plate configuration; the longest longitudinal direction of the source electrode plate 17 is the Y-direction; the next longest width direction is the Z-direction; and the shortest thickness direction is the X-direction. The lower end of the source electrode plate 17 is connected to the silicon substrate 10.

A silicon pillar 20 as a semiconductor member is provided inside the stacked body 15. The silicon pillar 20 extends in the Z-direction and pierces the stacked body 15; the lower end of the silicon pillar 20 is connected to the silicon substrate 10; and the upper end of the silicon pillar 20 protrudes from the upper surface of the stacked body 15. For example, the silicon pillar 20 is made of polysilicon; and the configuration of the silicon pillar 20 is a substantially circular tube having a plugged lower end portion. When viewed from the Z-direction, the silicon pillars 20 are arranged periodically along multiple columns, e.g., four columns. Each column extends in the Y-direction; and the positions of the silicon pillars 20 in the Y-direction are shifted one-half period between mutually-adjacent columns.

Multiple bit lines 22 and a source line 21 that extend in the X-direction are provided on the stacked body 15. The bit lines 22 are provided higher than the source line 21. The source line 21 is connected to the upper end of the source electrode plate 17 via a plug (not shown). Also, the bit lines 22 are connected to the upper ends of the silicon pillars 20 via plugs 23. Accordingly, the silicon pillars 20 are connected between the silicon substrate 10 and the bit lines 22.

In the stacked body 15, the electrode film 13 of one or multiple levels from the top functions as an upper selection gate line SGD; and an upper selection gate transistor STD is configured at each intersection between the upper selection gate line SGD and the silicon pillars 20. Also, the electrode film 13 of one or multiple levels from the bottom functions as a lower selection gate line SGS; and a lower selection gate transistor STS is configured at each intersection between the lower selection gate line SGS and the silicon pillars 20. The electrode films 13 other than the lower selection gate line SGS and the upper selection gate line SGD function as word lines WL; and a memory cell transistor MC is configured at each intersection between the word lines WL and the silicon pillars 20. Thereby, a NAND string is formed by the multiple memory cell transistors MC being connected in series along each silicon pillar 20 and by the lower selection gate transistor STS and the upper selection gate transistor STD being connected to the two ends of the multiple memory cell transistors MC.

As shown in FIG. 2, memory holes MH that extend in the Z-direction are made in the stacked body 15; and the silicon pillars 20 are disposed respectively inside the memory holes MH. Accordingly, the stacked body 15 surrounds the silicon pillars 20. When viewed from the Z-direction, the configuration of the memory hole MH is, for example, substantially a circle. A core member 25 that is made of silicon oxide is provided inside the silicon pillar 20. A diameter D1 of the portion of the silicon pillar 20 surrounded with the electrode film 13 is larger than a diameter D2 of the portion of the silicon pillar 20 surrounded with the silicon oxide film 12.

An end surface 13a of the electrode film 13 is recessed with respect to an end surface 12a of the silicon oxide film 12 at an inner surface MHa of the memory hole MH. In other words, a recess 31 is made in the inner surface MHa every electrode film 13. Also, the region of the inner surface MHa between the recesses 31 is a protrusion 12b of the silicon oxide film 12. The protrusion 12b protrudes toward the silicon pillar 20 at the inner surface MHa; and the thickness in the Z-direction of the protrusion 12b becomes thinner toward the tip.

A silicon oxide film 32 is provided on the inner surface MHa of the memory hole MH. The silicon oxide film 32 is provided to be continuous in the entire region of the inner surface MHa of each of the memory holes MH. A charge storage film 33 is provided on the portion of the silicon oxide film 32 disposed inside the recesses 31. The charge storage film 33 is a film that can store charge. The charge storage film 33 is formed of an insulating material having trap sites and is formed of, for example, silicon nitride (SiN).

On the portion of the silicon oxide film 32 disposed outside the recesses 31, the charge storage film 33 is not provided; and a silicon oxide film 34 is provided. Therefore, the charge storage film 33 is divided by the silicon oxide film 34 at the portion on the inner surface MHa surrounded with the silicon oxide film 12. Although the charge storage film 33 is divided every recess 31, the charge storage film 33 is disposed to be continuous on a back surface 31a of the recess 31, on an upper surface 31b of the recess 31, and on a lower surface 31c of the recess 31 inside each of the recesses 31.

A tunneling insulating film 35 is provided between the charge storage film 33 and the silicon pillar 20 and between the silicon pillar 20 and the silicon oxide films 34. The tunneling insulating film 35 is disposed to be continuous on the entire region of the inner surface MHa of each of the memory holes MH, i.e., substantially the entire side surface of the silicon pillar 20. Although the tunneling insulating film 35 normally is insulative, the tunneling insulating film 35 is a film in which a tunneling current flows when a prescribed voltage within the range of the drive voltage of the semiconductor memory device 1 is applied. The tunneling insulating film 35 is, for example, an ONO film in which a silicon oxide layer, a silicon nitride layer, and a silicon oxide layer are stacked in this order.

In the electrode film 13, for example, a main body unit 13c that is made of tungsten (W) and, for example, a barrier metal layer 13b that is made of titanium (Ti) or titanium nitride (TiN) are provided. The barrier metal layer 13b is provided on the upper surface of the main body unit 13c, on the lower surface of the main body unit 13c, and on the side surface of the main body unit 13c facing the silicon pillar 20.

A high dielectric constant film 36 that is made of, for example, a hafnium oxide (HfO) or aluminum oxide film (AlO) is provided on the upper surface of the electrode film 13, on the lower surface of the electrode film 13, and on the side surface of the electrode film 13 facing the silicon pillar 20. A blocking insulating film 37 is formed of the silicon oxide film 32 and the high dielectric constant film 36. The blocking insulating film 37 is a film in which a current substantially does not flow even when a voltage within the range of the drive voltage of the semiconductor memory device 1 is applied. The average dielectric constant of the entire blocking insulating film 37 is higher than the average dielectric constant of the entire tunneling insulating film 35.

A method for manufacturing the semiconductor memory device according to the embodiment will now be described.

FIG. 3 to FIG. 15 are cross-sectional views showing the method for manufacturing the semiconductor memory device according to the embodiment and show a cross section corresponding to FIG. 2.

First, as shown in FIG. 1, the silicon oxide film 11 is formed on the silicon substrate 10.

Figure 3:
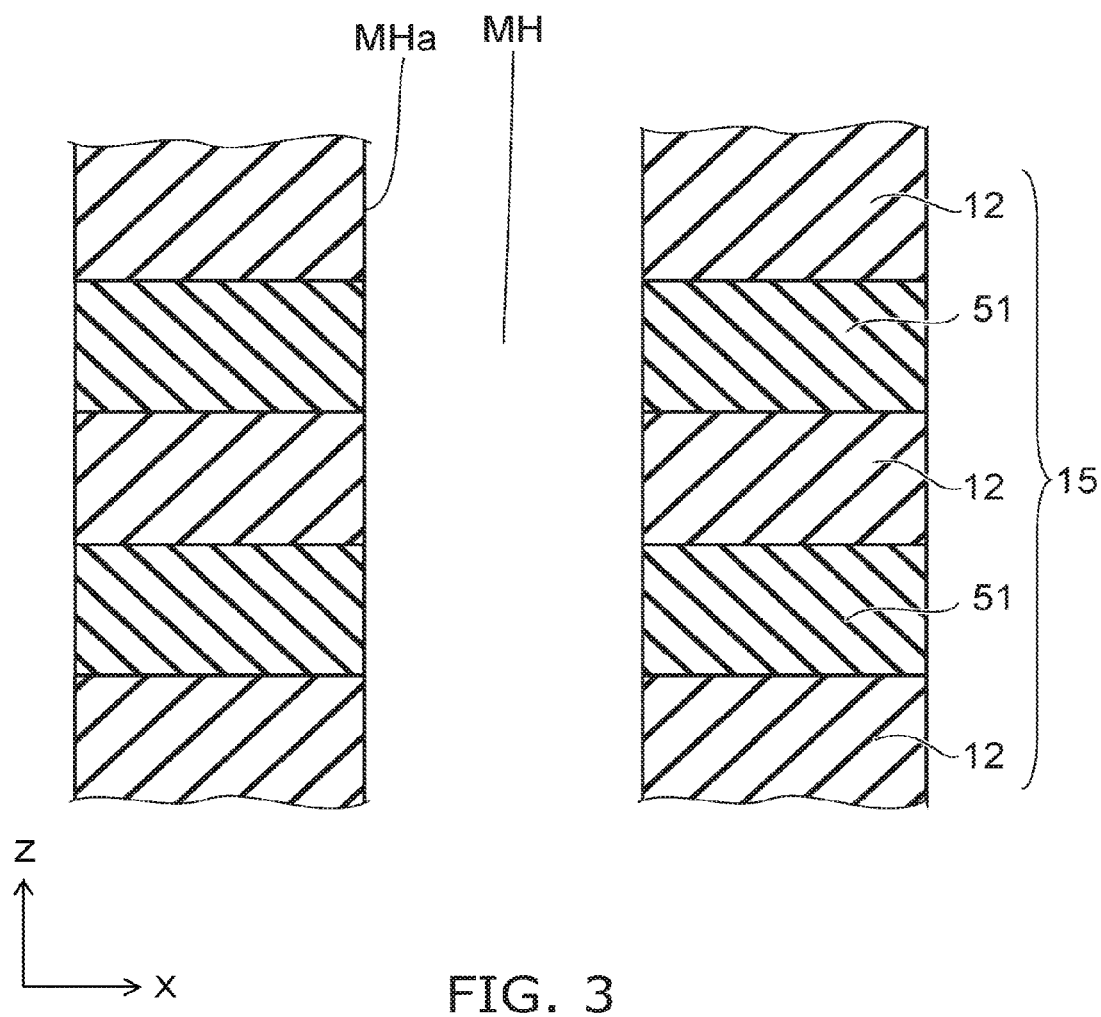
FIG. 3 to FIG. 15 are cross-sectional views showing a method for manufacturing a semiconductor memory device according to the first embodiment.

Then, as shown in FIG. 3, the silicon oxide films 12 and silicon nitride films 51 are formed alternately. The stacked body 15 is formed of the silicon oxide film 11 (referring to FIG. 1), the multiple silicon oxide films 12, and the multiple silicon nitride films 51. Then, the memory hole MH that extends in the Z-direction is made in the stacked body 15 by, for example, lithography and RIE (Reactive Ion Etching). Then, epitaxial growth of the silicon is performed from the portion of the silicon substrate 10 (referring to FIG. 1) exposed at the bottom surface of the memory hole MH.

Figure 4:
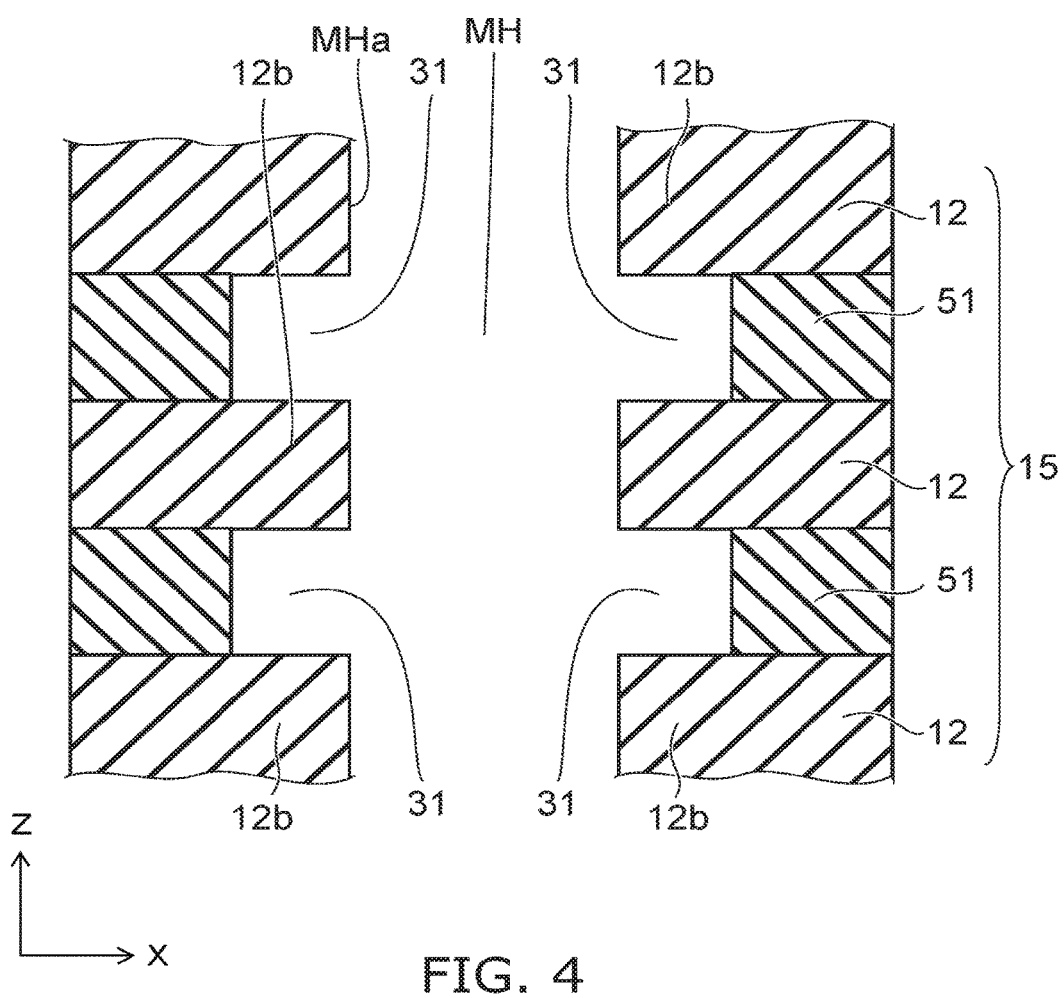

Then, as shown in FIG. 4, a portion of each of the silicon nitride films 51 is removed by performing wet etching or dry etching via the memory hole MH. Thereby, the region of the inner surface MHa of the memory hole MH corresponding to the silicon nitride films 51 recedes; and the recesses 31 are made. The depth of the recess 31 is, for example, about several nm (nanometers) to several tens of nm. The regions between the recesses 31 in the Z-direction become the protrusions 12b of the silicon oxide films 12.

Figure 5:
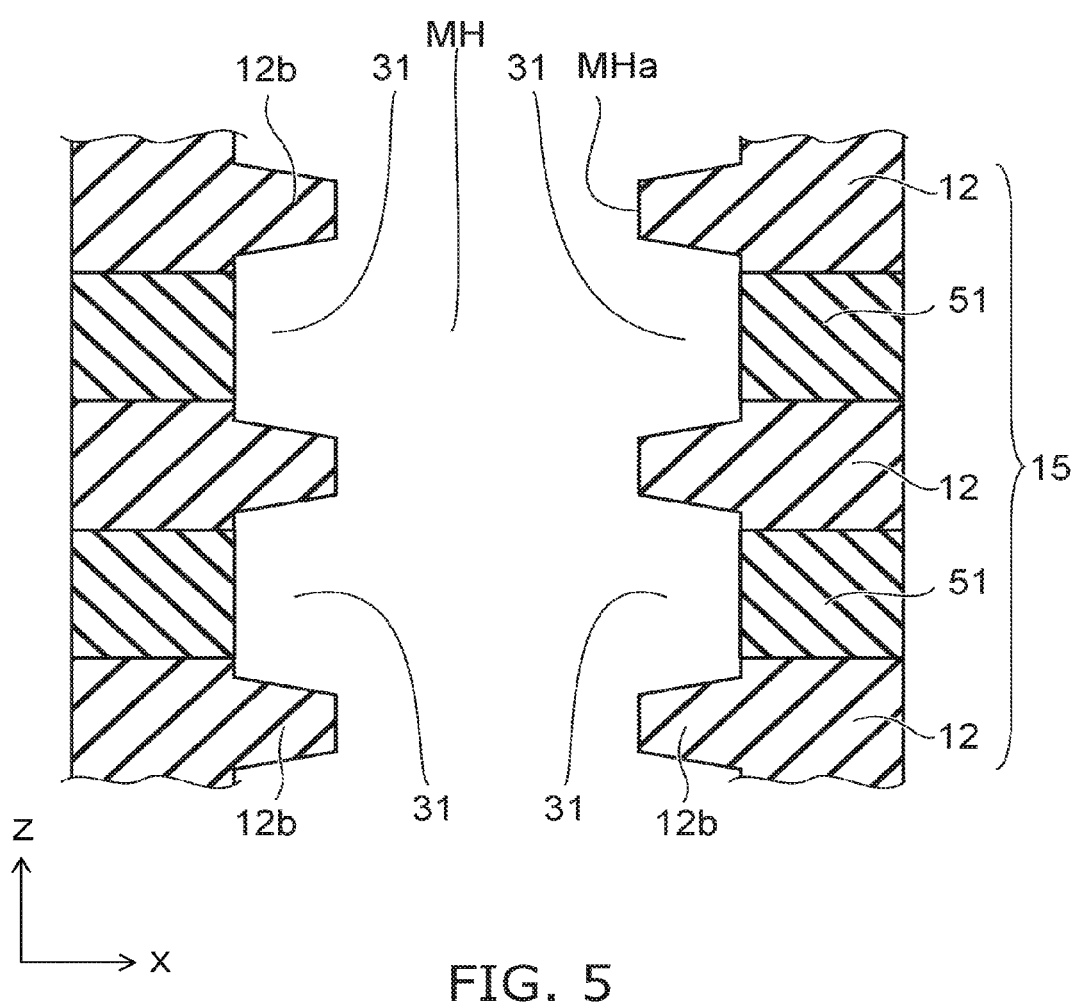

Then, as shown in FIG. 5, slimming of the protrusions 12b is performed by performing etching of the protrusions 12b of the silicon oxide films 12 by, for example, wet etching using DHF (Diluted Hydrofluoric Acid). Thereby, the thickness in the Z-direction of the protrusion 12b becomes thinner toward the tip. This process may be omitted.

Figure 6:
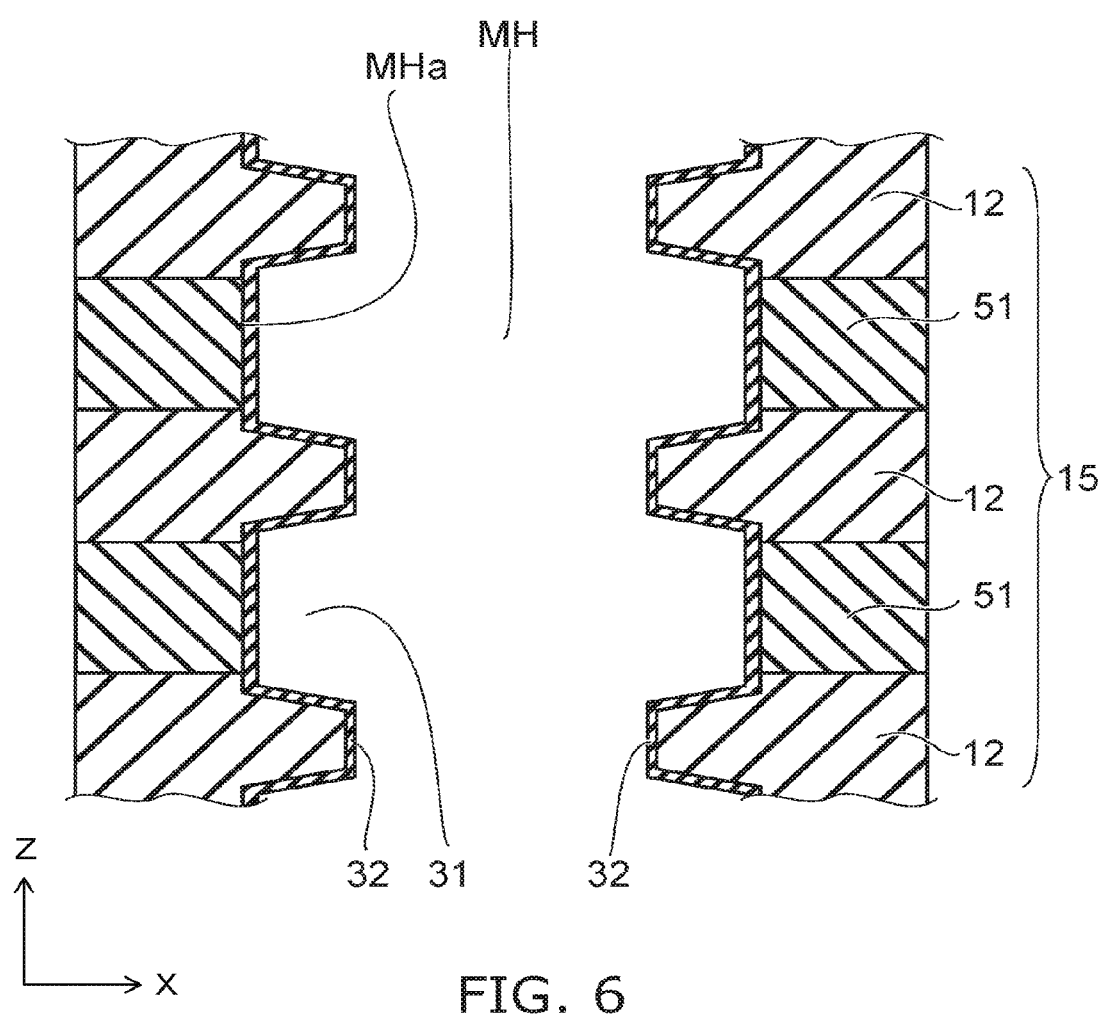

Then, as shown in FIG. 6, the silicon oxide film 32 is formed substantially uniformly on the inner surface MHa of the memory hole MH by depositing silicon oxide by, for example, CVD (Chemical Vapor Deposition). Instead of depositing silicon oxide, the silicon oxide film 32 may be formed by oxidizing the surfaces of the silicon nitride films 51 by performing oxidation treatment such as radical oxidation, etc. In such a case, the silicon oxide film 32 is formed on the surfaces of the silicon nitride films 51 but is not formed on the surfaces of the silicon oxide films 12.

Figure 7:
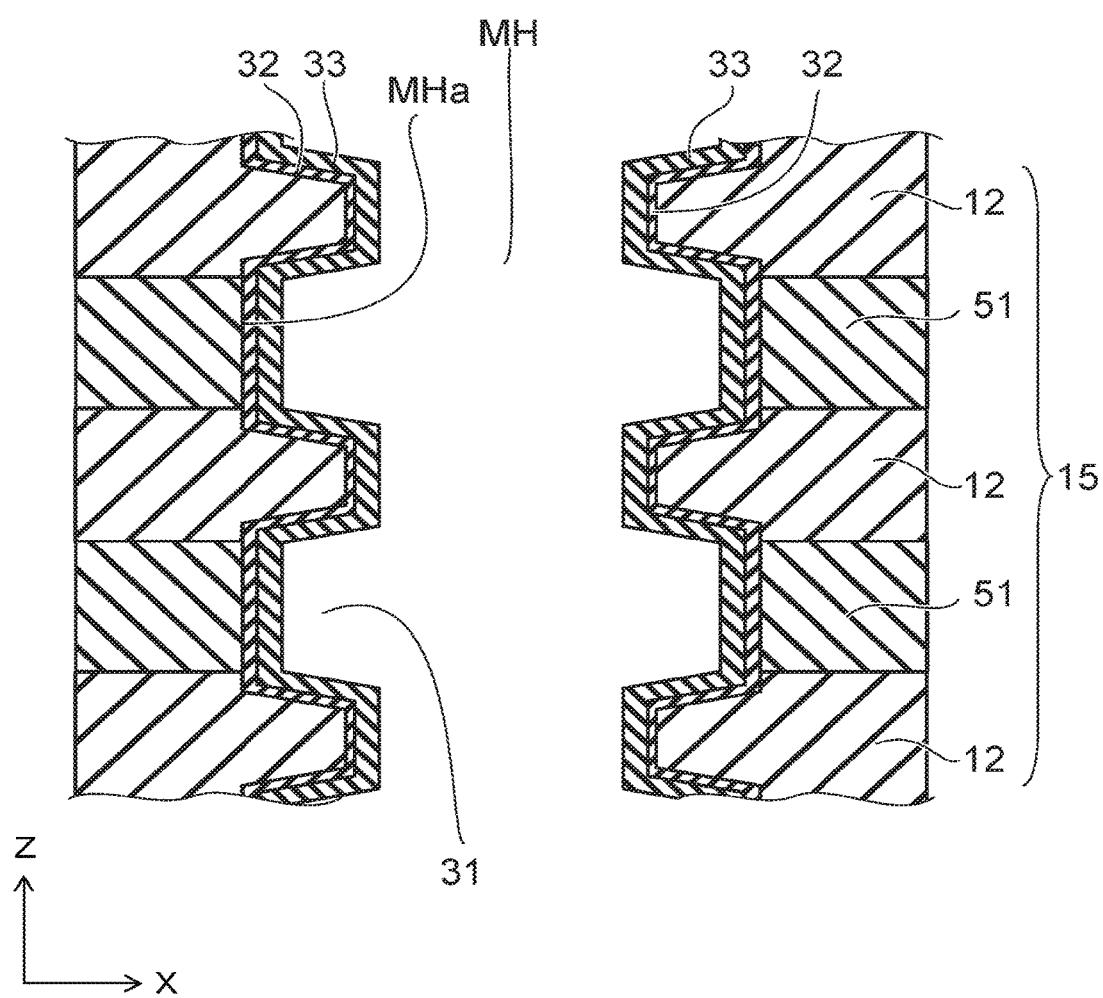

Then, as shown in FIG. 7, the charge storage film 33 is formed on the surface of the silicon oxide film 32 by depositing silicon nitride by, for example, CVD. The charge storage film 33 is formed as a continuous film on the entire region on the inner surfaces of the memory hole MH and the recesses 31.

Figure 8:
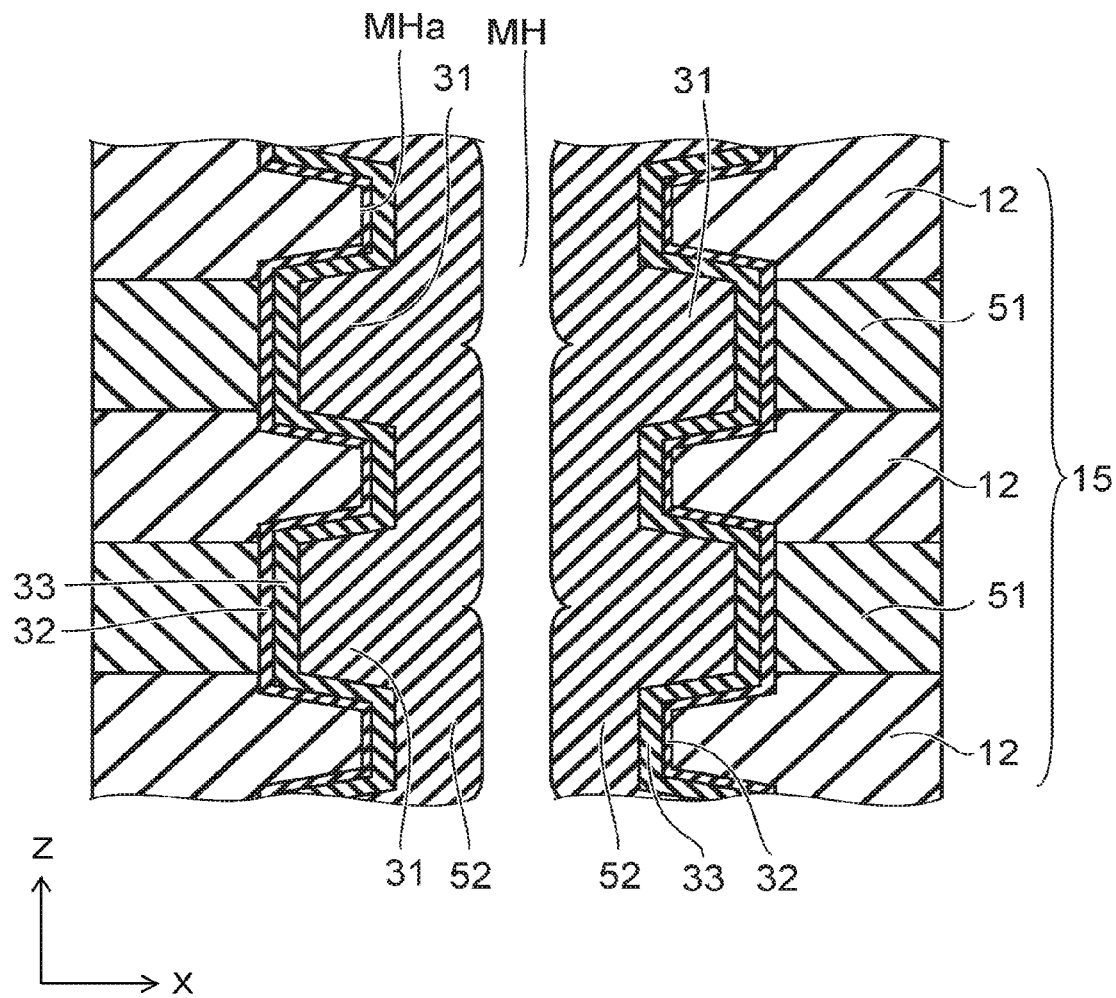

Then, as shown in FIG. 8, a sacrificial film 52 is formed on the surface of the charge storage film 33 by depositing a material having a composition different from that of the charge storage film 33, e.g., silicon oxide, by, for example, CVD. The thickness of the sacrificial film 52 is thick enough to fill the recesses 31 but thin enough not to plug the memory hole MH.

Figure 9:
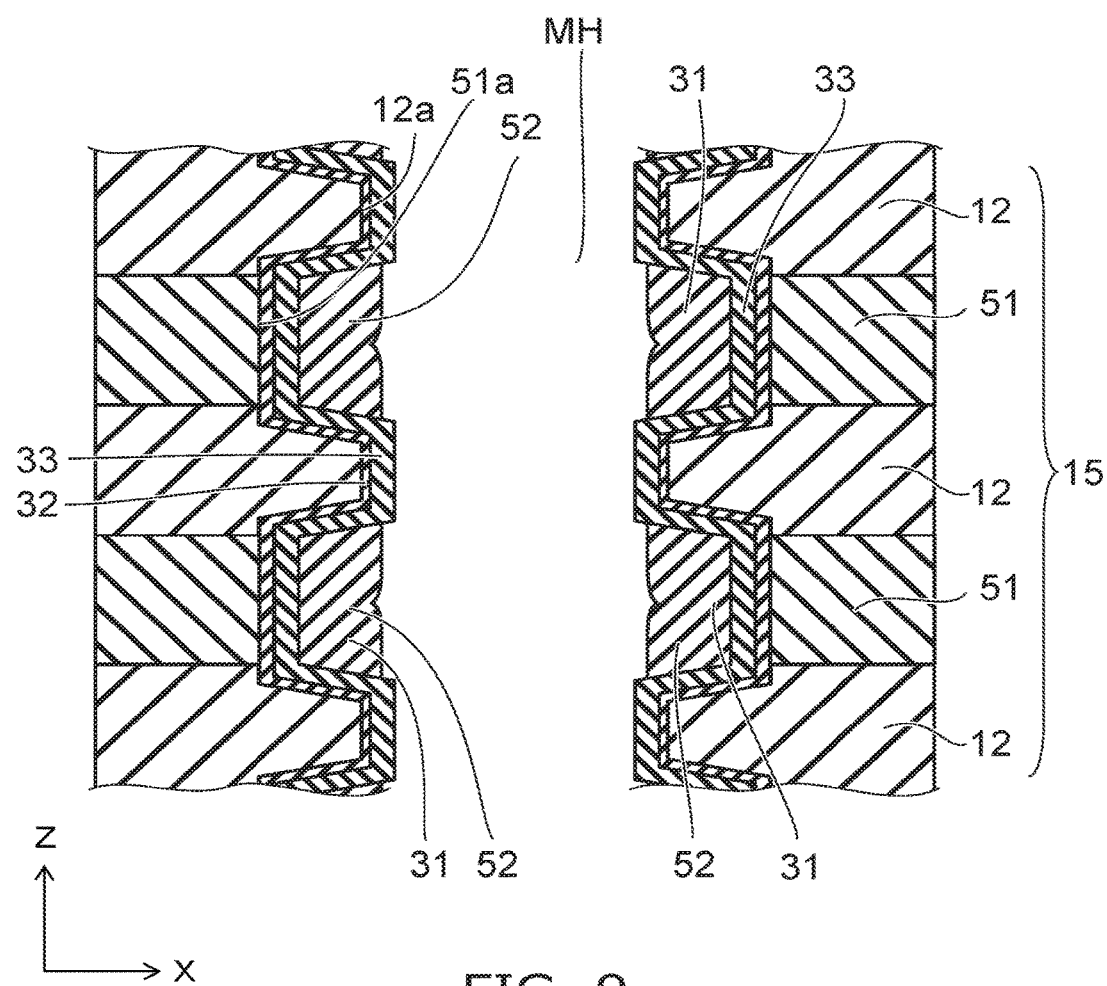

Then, as shown in FIG. 9, the portion of the sacrificial film 52 deposited outside the recesses 31 is removed by performing etching such as CDE (Chemical Dry Etching), etc., of the sacrificial film 52. The sacrificial film 52 is caused to remain inside the recesses 31. Thereby, the sacrificial film 52 covers the portion of the charge storage film 33 disposed inside the recesses 31, does not cover the portion of the charge storage film 33 disposed outside the recesses 31, and is exposed inside the memory hole MH.

Figure 10:
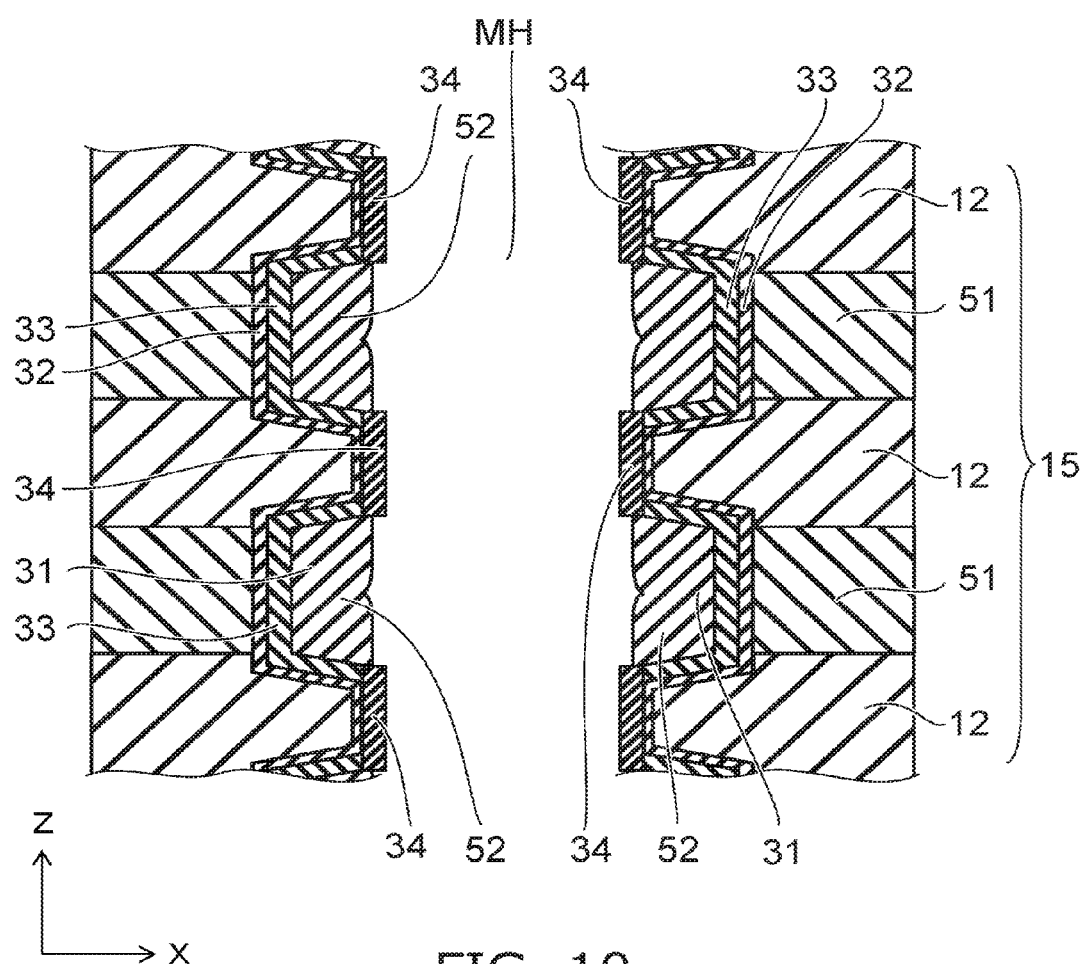

Then, as shown in FIG. 10, oxidation treatment such as ISSG (In-Situ Steam Generation) oxidation or the like is performed. ISSG oxidation is a method for forming an oxide film by directly introducing hydrogen and oxygen into a chamber and by generating water vapor inside the chamber. Thereby, the exposed portion of the charge storage film 33 is oxidized; and the silicon oxide films 34 are formed. At this time, the charge storage film 33 substantially is not oxidized and remains as-is because the portion of the charge storage film 33 disposed inside the recesses 31 is protected by the sacrificial film 52. As a result, the charge storage film 33 is divided every recess 31.

Figure 11:
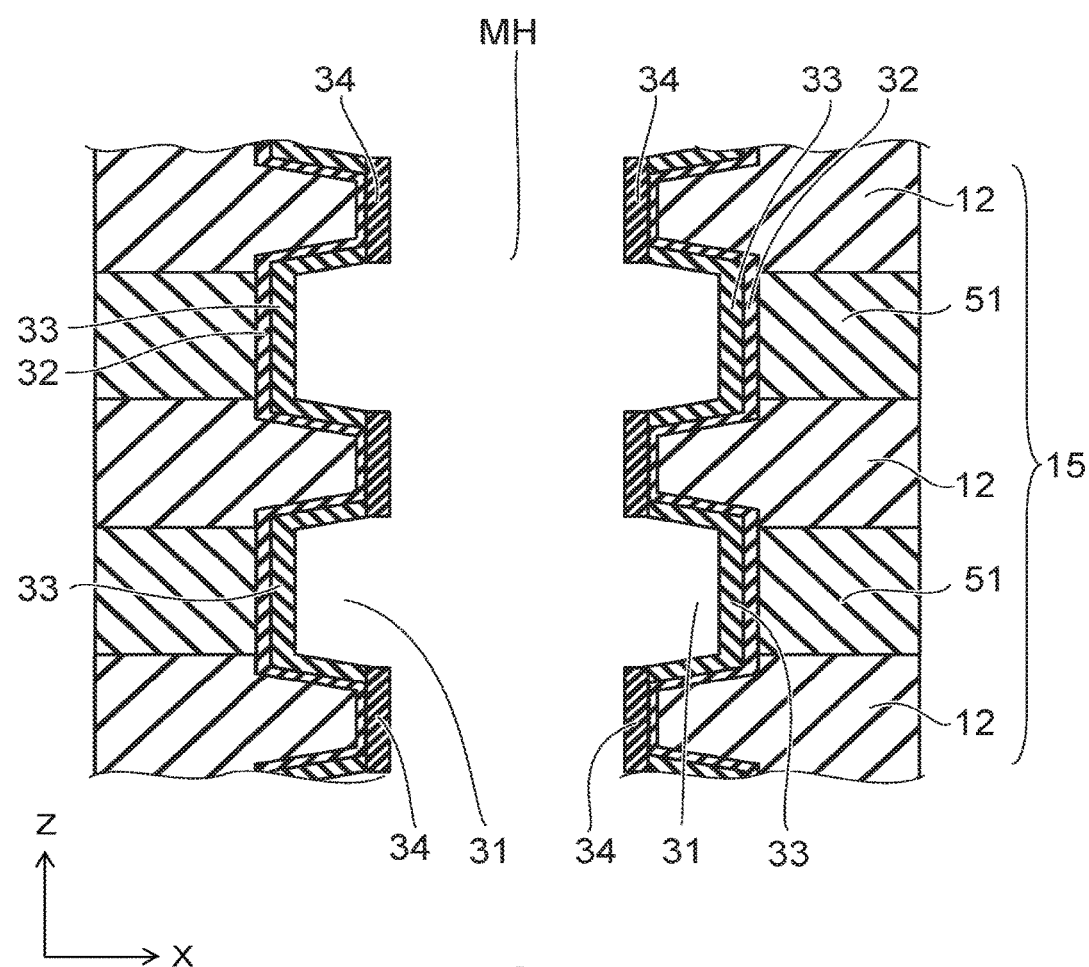

Then, as shown in FIG. 11, the sacrificial film 52 (referring to FIG. 10) is removed by performing wet etching or dry etching using hydrofluoric acid. At this time, the surface layer portions of the silicon oxide films 34 also are removed.

Figure 12:
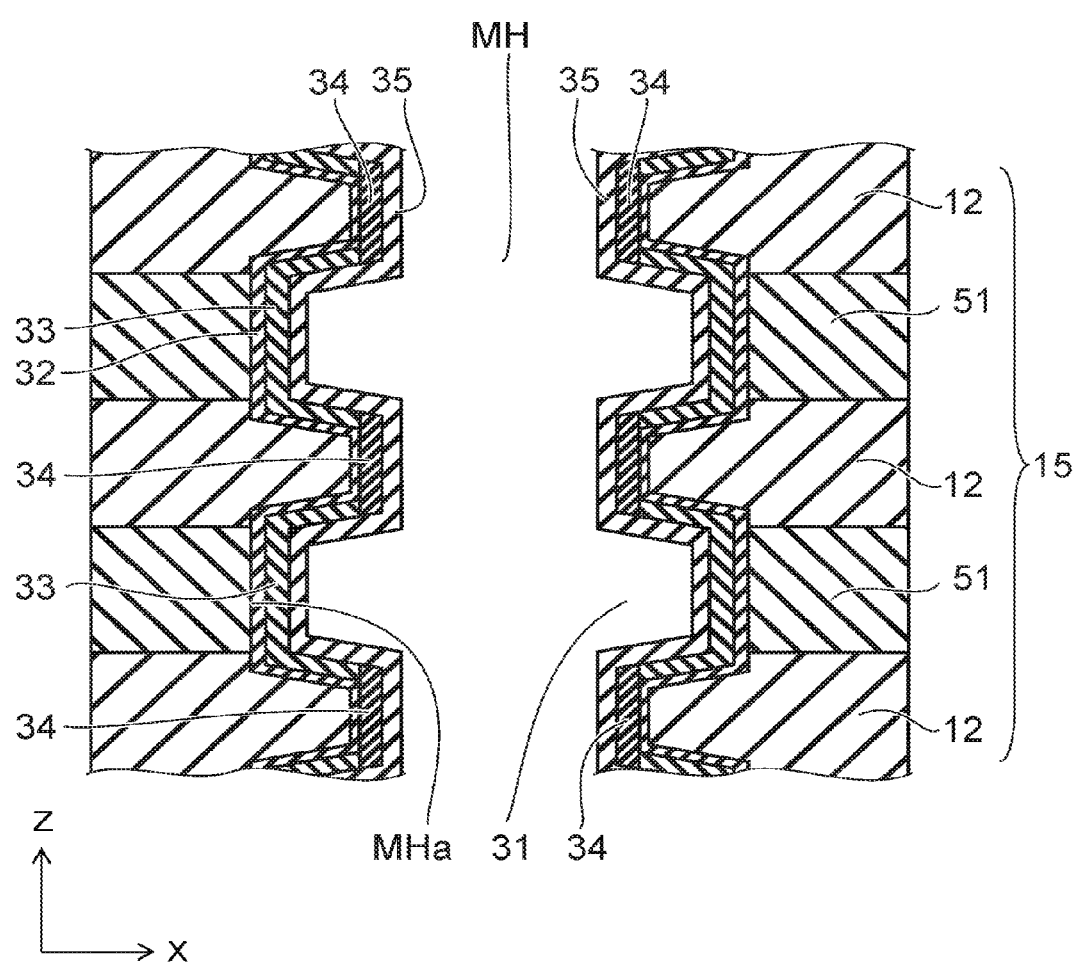

Then, as shown in FIG. 12, the tunneling insulating film 35 is formed on the side surfaces of the charge storage films 33 and on the side surfaces of the silicon oxide films 34 by forming a silicon oxide layer, a silicon nitride layer, and a silicon oxide layer in this order. The tunneling insulating film 35 is formed continuously on the inner surface MHa of the memory hole MH.

Figure 13:
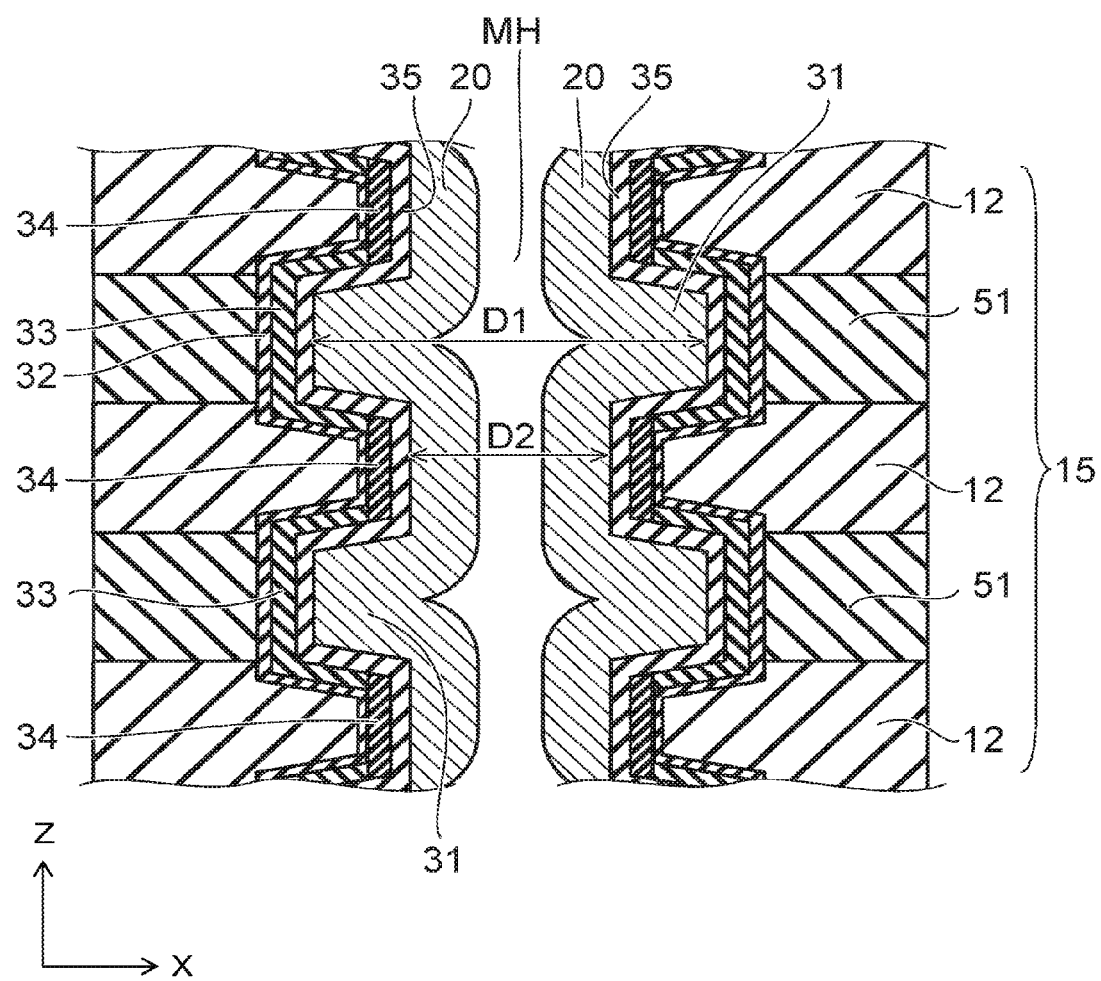

Then, as shown in FIG. 13, the silicon pillar 20 is formed on the surface of the tunneling insulating film 35 by removing the tunneling insulating film 35, the charge storage film 33, and the silicon oxide film 32 from the bottom surface of the memory hole MH (not shown) and by depositing silicon. Thereby, a circular tubular silicon pillar 20 having a plugged lower end is formed inside the memory hole MH. Because the silicon pillar 20 is filled also into the recesses 31, the diameter D1 of the portions of the silicon pillar 20 surrounded with the silicon nitride films 51 is larger than the diameter D2 of the portions of the silicon pillar 20 surrounded with the silicon oxide films 12.

Figure 14:
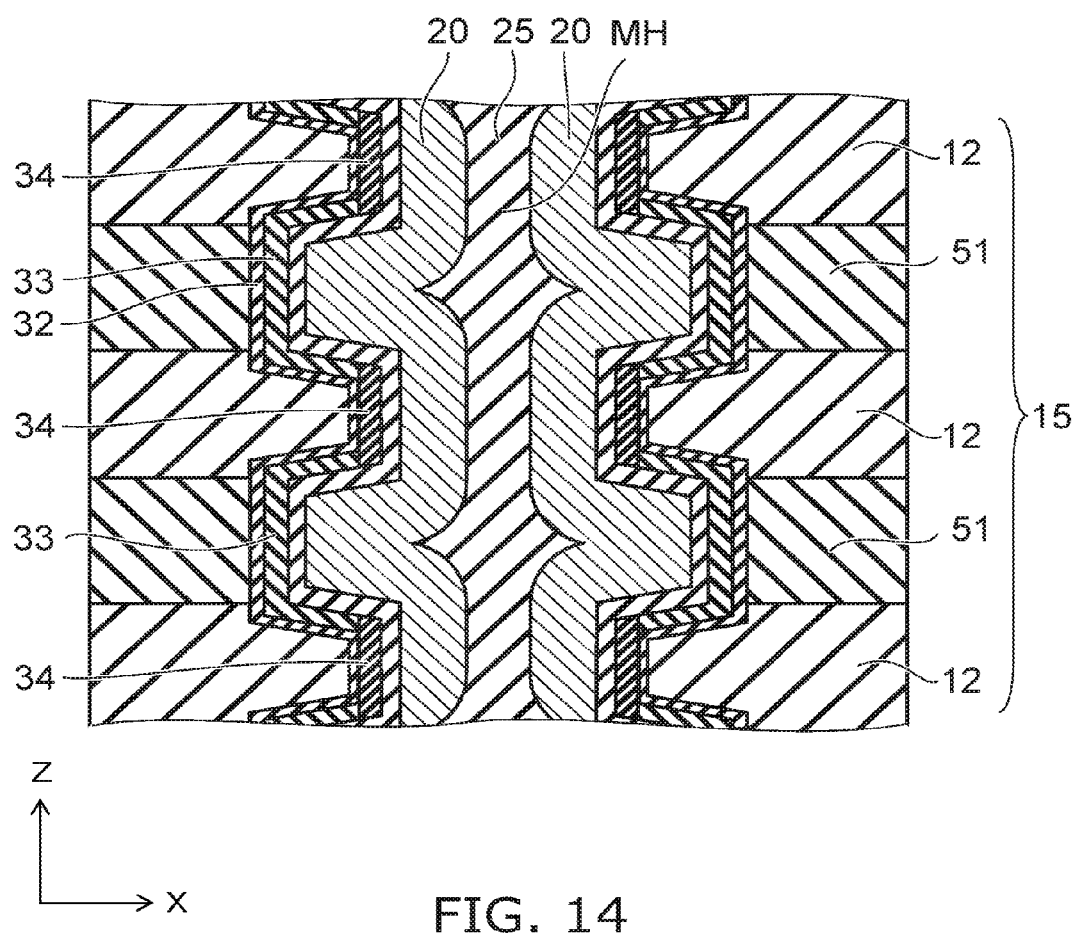

Then, as shown in FIG. 14, the core member 25 is formed inside the silicon pillar 20 by depositing silicon oxide.

Figure 15:
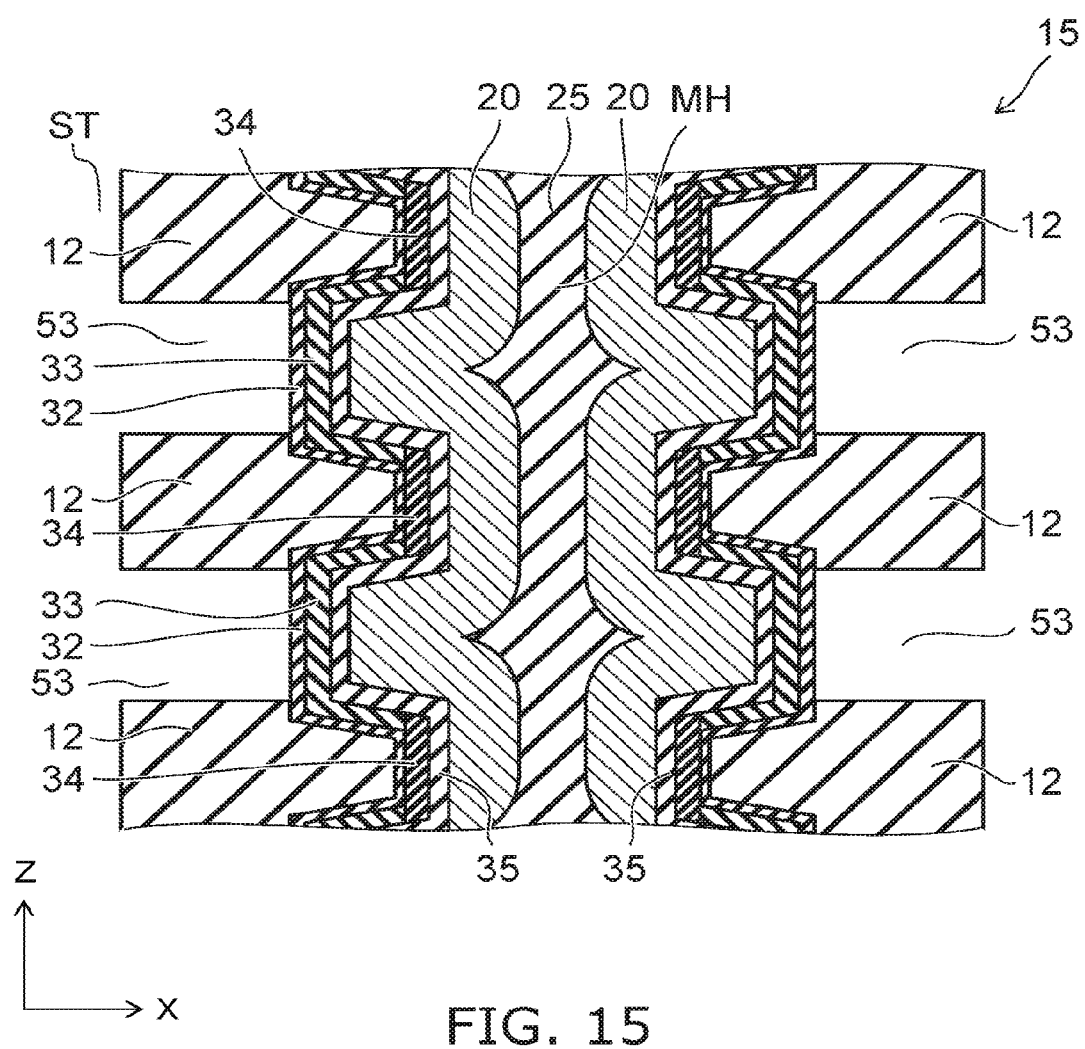

Then, as shown in FIG. 15, a slit ST that extends in the Y-direction is made in a portion of the stacked body 15 where the memory holes MH are not made. The slit ST is caused to reach the silicon substrate 10. Then, the remainder of the silicon nitride films 51 (referring to FIG. 14) is removed by performing etching via the slit ST. At this time, the silicon oxide film 32 functions as an etching stopper. Thereby, recesses 53 are made in the side surface of the slit ST.

Then, as shown in FIG. 2, a high dielectric constant material, e.g., hafnium oxide or aluminum oxide, is deposited via the slit ST. Thereby, the high dielectric constant film 36 is formed on the inner surfaces of the slit ST and the recesses 53. The high dielectric constant film 36 contacts the silicon oxide film 32. The blocking insulating film 37 is formed of the silicon oxide film 32 and the high dielectric constant film 36.

Then, the barrier metal layer 13b is formed on the surface of the blocking insulating film 37 via the slit ST. Then, the main body unit 13c is formed on the barrier metal layer 13b by filling a conductive material such as tungsten, etc., via the slit ST. The electrode film 13 is formed of the barrier metal layer 13b and the main body unit 13c. Then, the portion of the electrode film 13 formed outside the recesses 53 is removed by performing etching. Thereby, the electrode film 13 is divided every recess 53.

Then, as shown in FIG. 1, the source electrode plate 17 is formed inside the slit ST by forming an insulating film (not shown) on the side surface of the slit ST. Then, an insulating film (not shown) is formed on the stacked body 15; and the plugs 23 are formed inside the insulating film. The plugs 23 are connected to the silicon pillar 20. Then, the source line 21 that extends in the X-direction is formed on the insulating film and is connected to the source electrode plates 17 via plugs (not shown). Also, the bit lines 22 that extend in the X-direction are formed on the insulating film and connected to the plugs 23. Thus, the semiconductor memory device 1 according to the embodiment is manufactured.

Operations of the semiconductor memory device according to the embodiment will now be described briefly.

First, a programming operation will be described.

As shown in FIG. 1, the silicon pillars 20 are set to the ground potential by applying the ground potential to the source line 21 and the bit lines 22. On the other hand, a positive programming potential is applied to the word line WL to be selected; and an ON potential is applied to the unselected word lines WL. The ON potential is a potential such that the memory cell transistor MC is switched to the conducting state regardless of whether or not electrons are stored in the charge storage film 33. The programming potential is higher than the ON potential. Thereby, in the memory cell transistor MC to be programmed, the electrons inside the silicon pillar 20 pass through the tunneling insulating film 35 as tunneling current and are injected into the charge storage film 33. When the electrons are injected into the charge storage film 33, the threshold of the memory cell transistor MC changes. Thereby, data is programmed to the memory cell transistor MC.

A read-out operation will now be described.

A read-out potential is applied to the word line WL to be selected; and the ON potential is applied to the unselected word lines WL. The read-out potential is a potential such that the conducting state of the memory cell transistor MC is different between whether or not electrons are stored in the charge storage film 33. Then, it is determined whether or not the electrons are stored in the charge storage film 33 by measuring the current flowing in the silicon pillar 20; and the value of the memory cell transistor MC is read.

Effects of the embodiment will now be described.

In the embodiment, the recesses 31 are made in the inner surface MHa of the memory hole MH in the process shown in FIG. 4. Therefore, as shown in FIG. 2, in the semiconductor memory device 1 after completion, the protrusions 12b of the silicon oxide films 12 are interposed between the charge storage films 33 adjacent to each other in the Z-direction. Thereby, the effective current path between the charge storage films 33 adjacent to each other in the Z-direction is longer; and the movement of the electrons between the charge storage films 33 can be suppressed. Therefore, the retention characteristics of the data are high for the semiconductor memory device 1.

Also, in the semiconductor memory device 1 as shown in FIG. 2, the charge storage film 33 is divided every electrode film 13 by the silicon oxide film 34. Therefore, the electrons that are stored in the charge storage film 33 of one memory cell transistor MC do not move into another memory cell transistor MC by being conducted through the charge storage film 33. Because the movement of the electrons can be suppressed by this as well, the retention characteristics of the data can be improved.

As a result, even in the case where the semiconductor memory device 1 has higher integration and the distance between the charge storage films 33 in the Z-direction is set to be shorter, the movement of the electrons between the charge storage films 33 adjacent to each other in the Z-direction can be suppressed. This effect is particularly effective when the electron amount stored in one charge storage film 33 of the charge storage films 33 adjacent to each other in the Z-direction is more than the electron amount stored in another charge storage film 33 of the charge storage films 33 adjacent to each other in the Z-direction and when an electric field that promotes the movement of the electrons between the charge storage films 33 is generated.

(Second Embodiment)

A second embodiment will now be described.

Figure 16:
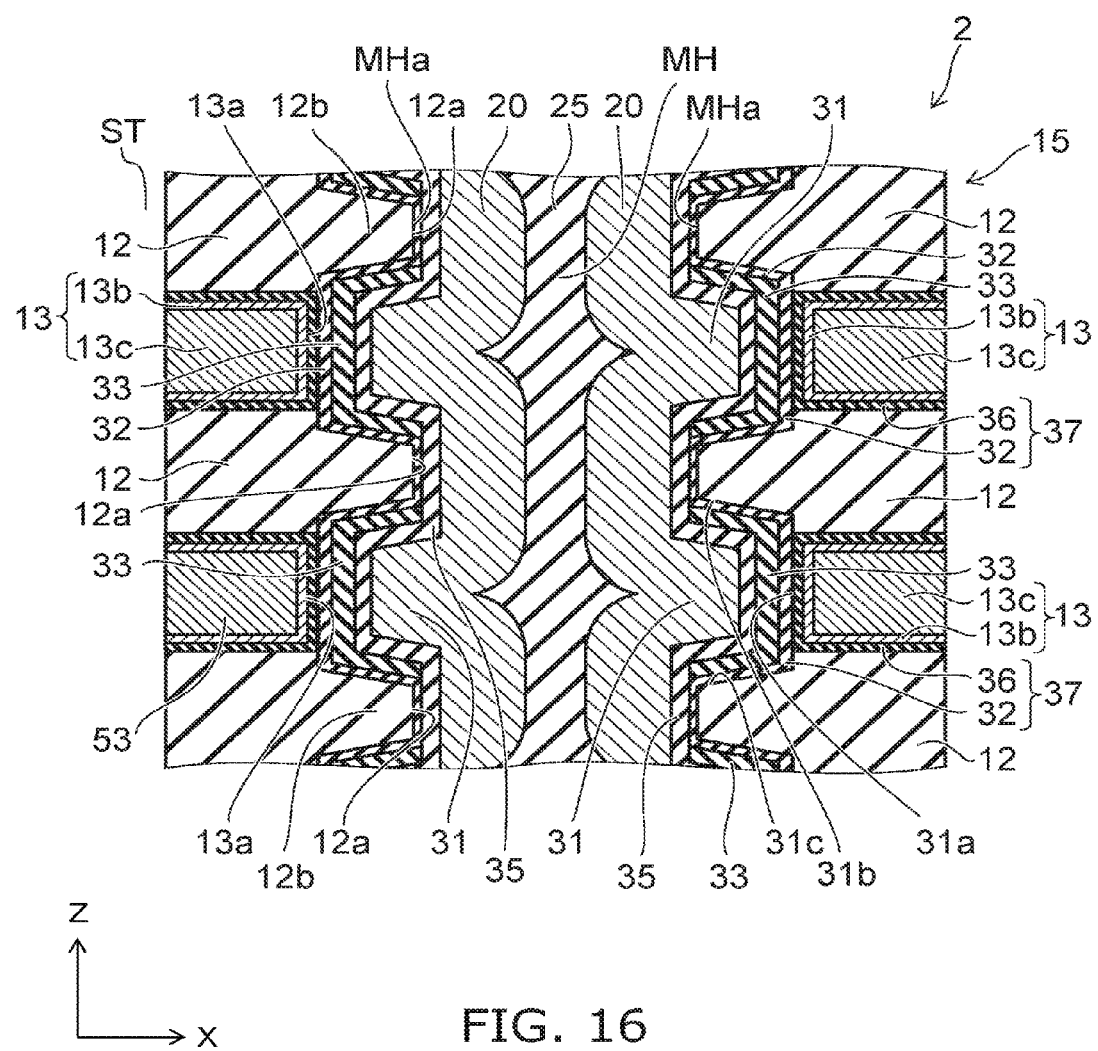
FIG. 16 is a cross-sectional view showing a semiconductor memory device according to a second embodiment.

FIG. 16 is a cross-sectional view showing a semiconductor memory device according to the embodiment.

As shown in FIG. 16, the semiconductor memory device 2 according to the embodiment differs from the semiconductor memory device 1 according to the first embodiment described above (referring to FIG. 2) in that the silicon oxide film 34 is not provided. The charge storage film 33 is divided every recess 31; and the tunneling insulating film 35 is provided to be continuous along the Z-direction.

A method for manufacturing the semiconductor memory device 2 according to the embodiment will now be described.

Figure 17:
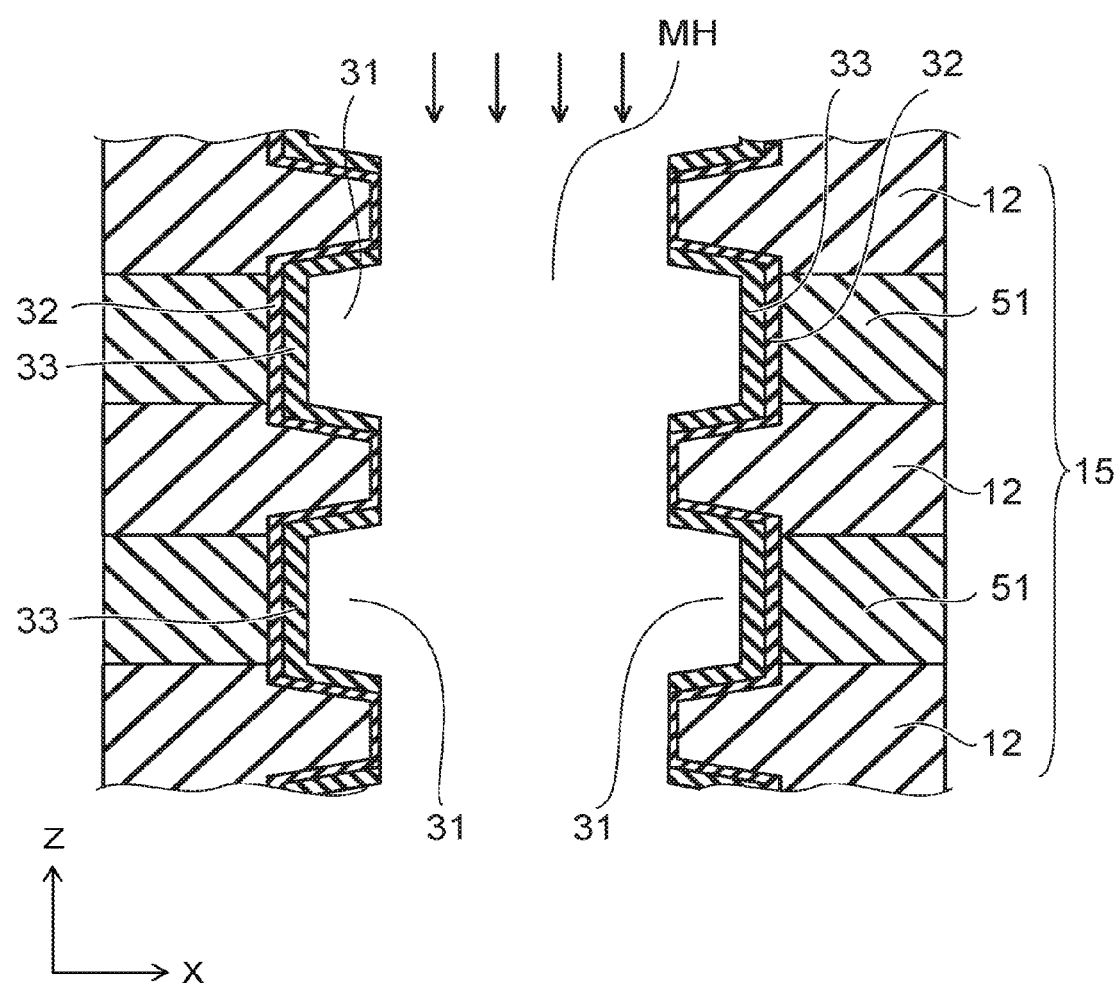
FIG. 17 is a cross-sectional view showing a method for manufacturing a semiconductor memory device according to the second embodiment.

FIG. 17 is a cross-sectional view showing the method for manufacturing the semiconductor memory device according to the embodiment.

First, the processes shown in FIG. 3 to FIG. 7 are implemented.

Then, as shown in FIG. 17, by performing anisotropic etching via the memory hole MH from above, the portion of the charge storage film 33 disposed outside the recesses 31 is removed; and the portion of the charge storage film 33 disposed in the interiors of the recesses 31 is caused to remain. Thereby, the charge storage film 33 is divided every recess 31. Then, the processes shown in FIG. 12 to FIG. 15 are implemented. The method for manufacturing thereafter is similar to that of the first embodiment. Thus, the semiconductor memory device 2 according to the embodiment is manufactured.

According to the embodiment as well, effects similar to those of the first embodiment can be obtained. The embodiment is favorable in the case where the etch-back amount of the silicon nitride films 51 in the process shown in FIG. 4 is high and the charge storage film 33 can be patterned with high precision by the anisotropic etching in the process shown in FIG. 17. Otherwise, the configuration, the manufacturing method, the operations, and the effects of the embodiment are similar to those of the first embodiment described above. Even in the case where the portion of the charge storage film 33 disposed outside the recesses 31 is not removed completely in the process shown in FIG. 17, if a portion of the charge storage film 33 is removed, the electronic conduction inside the charge storage film 33 can be suppressed; and the retention characteristics of the data can be improved somewhat.

(Third Embodiment)

A third embodiment will now be described.

Figure 18:
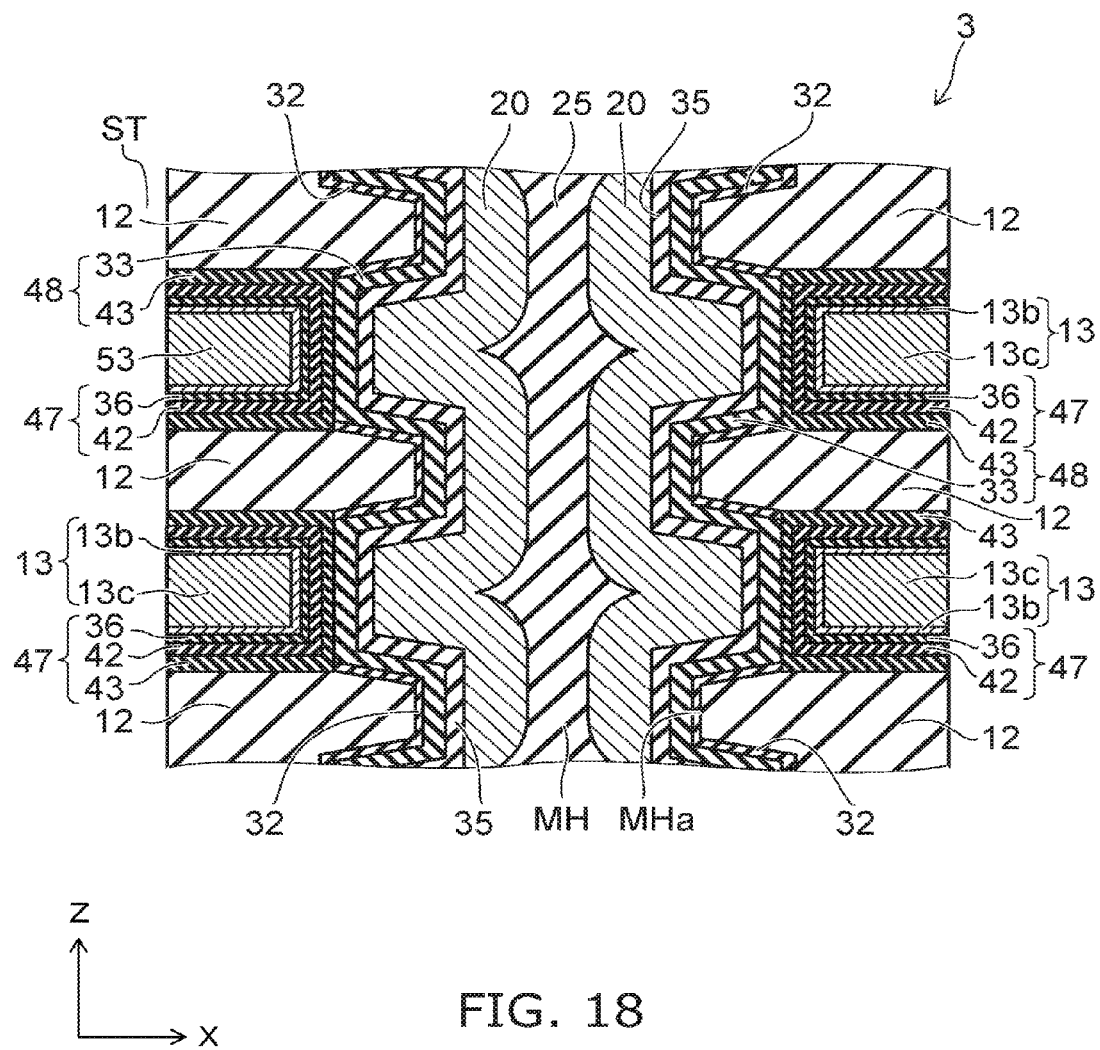
FIG. 18 is a cross-sectional view showing a semiconductor memory device according to a third embodiment.

FIG. 18 is a cross-sectional view showing a semiconductor memory device according to the embodiment.

As shown in FIG. 18, the semiconductor memory device 3 according to the embodiment differs from the semiconductor memory device 1 according to the first embodiment described above (referring to FIG. 2) in that the silicon oxide film 34 (referring to FIG. 2) is not provided; and the charge storage film 33 is provided to be continuous along the inner surface MHa of the memory hole MH.

Also, in the semiconductor memory device 3, the high dielectric constant film 36, a silicon oxide film 42, and a charge storage film 43 are stacked in this order on the upper surface of the electrode film 13, on the lower surface of the electrode film 13, and on the side surface of the electrode film 13 facing the silicon pillar 20. A blocking insulating film 47 is formed of the high dielectric constant film 36 and the silicon oxide film 42.

The charge storage film 43 contacts the charge storage film 33. The charge storage films 33 and 43 function as one charge storage film 48 in each of the memory cell transistors MC (referring to FIG. 1). In other words, the charge storage film 48 is a two-layer film made of the charge storage films 33 and 43; the charge storage film 33 is provided to be continuous between the stacked body 15 and the silicon pillar 20; and the charge storage film 43 is provided between the electrode film 13 and the silicon oxide film 12 and between the electrode film 13 and the charge storage film 33.

Therefore, in the portion surrounded with the silicon oxide film 12 inside the memory hole MH, the charge storage film 33 is disposed; but the charge storage film 43 is not disposed. On the other hand, both the charge storage films 33 and 43 are disposed in the portion surrounded with the electrode film 13. Therefore, the average film thickness of the portion of the charge storage film 48 surrounded with the silicon oxide film 12, i.e., the portion of the charge storage film 48 disposed on the end surface 12a of the silicon oxide film 12, is thinner than the average thickness of the portion of the charge storage film 48 surrounded with the electrode film 13, i.e., the portion of the charge storage film 48 disposed on the end surface 13a of the electrode film 13.

A method for manufacturing the semiconductor memory device according to the embodiment will now be described.

FIG. 19 to FIG. 22 are cross-sectional views showing the method for manufacturing the semiconductor memory device according to the embodiment.

First, the processes shown in FIG. 3 to FIG. 7 are implemented. However, the thicknesses of the silicon oxide film 32 and the charge storage film 33 are thinner than those of the first embodiment described above.

Then, without implementing the processes shown in FIG. 8 to FIG. 11, the tunneling insulating film 35 is formed on the surface of the silicon oxide film 32 as shown in FIG. 12; the silicon pillar 20 is formed on the surface of the tunneling insulating film 35 as shown in FIG. 13; and the core member 25 is formed inside the silicon pillar 20 as shown in FIG. 14.

Figure 19:
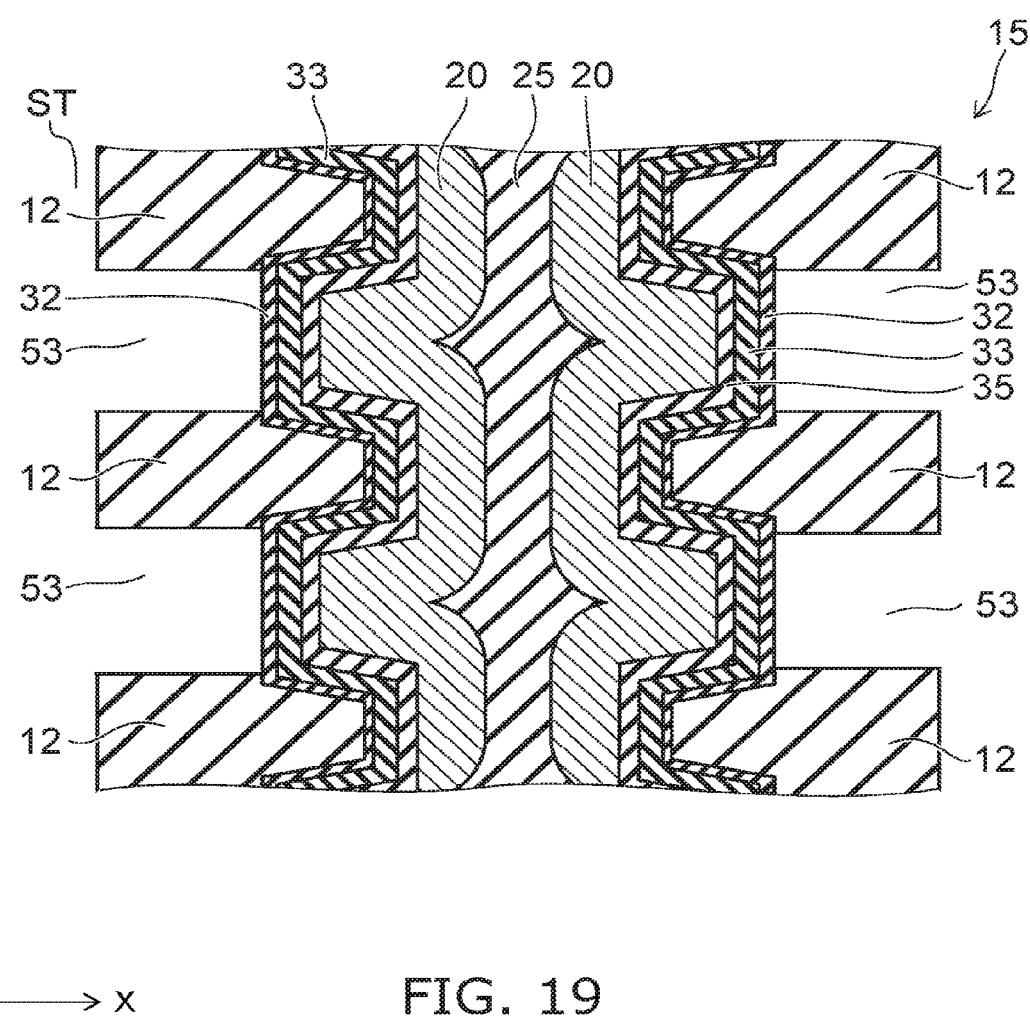
FIG. 19 to FIG. 22 are cross-sectional views showing a method for manufacturing a semiconductor memory device according to the third embodiment.

Then, as shown in FIG. 19, the slit ST is made in the stacked body 15; and the remainder of the silicon nitride films 51 (referring to FIG. 14) is removed via the slit ST. Thereby, the recesses 53 are made in the side surface of the slit ST. At this time, the silicon oxide film 32 is exposed at the back surfaces of the recesses 53.

Figure 20:
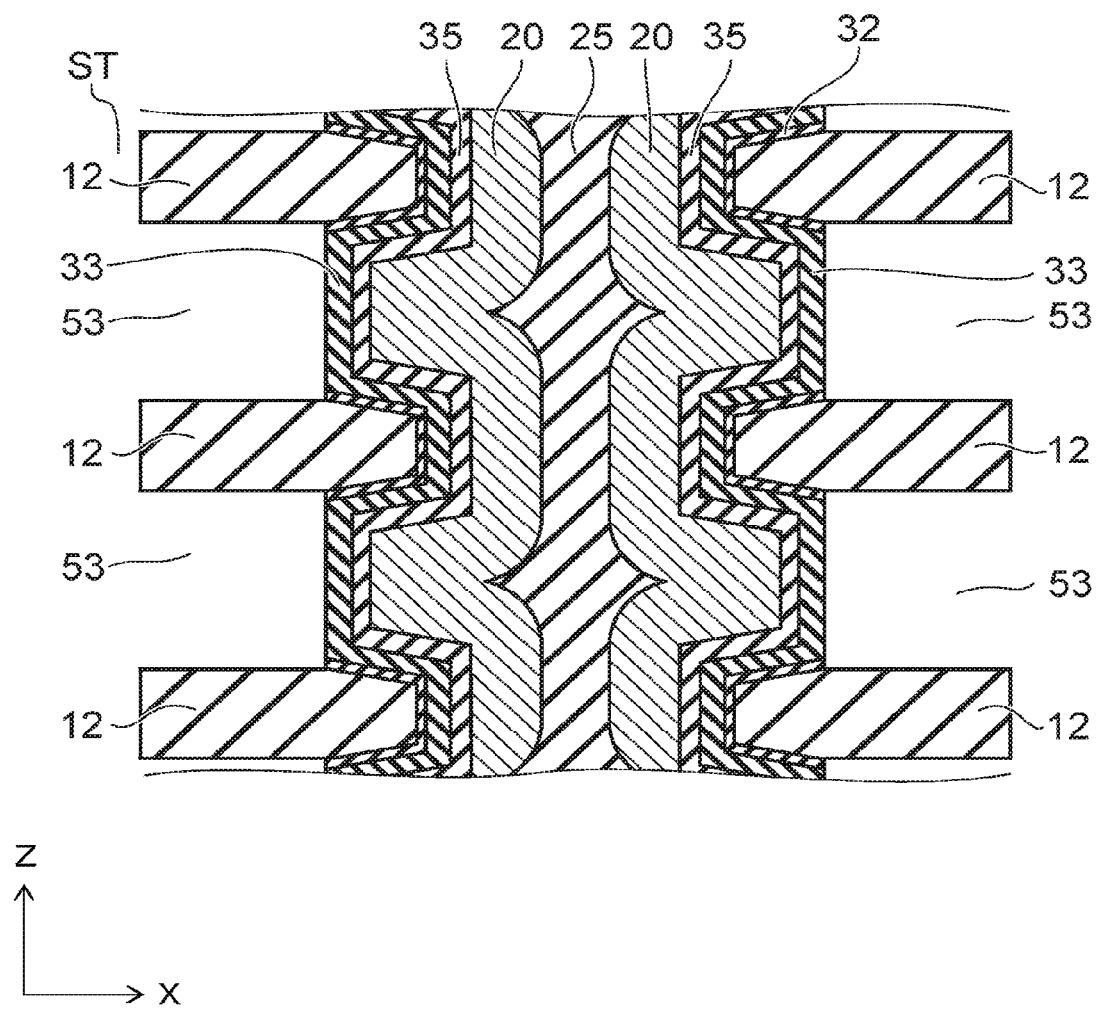

Then, as shown in FIG. 20, the thickness in the Z-direction of the silicon oxide film 12 is reduced by slimming the silicon oxide film 12 by performing etching such as CDE, etc. Thereby, the recesses 53 are enlarged in the Z-direction. Then, the portion of the silicon oxide film 32 exposed at the back surfaces of the recesses 53 is removed via the slit ST and the recesses 53 by performing wet etching using hydrofluoric acid or dry etching such as CDE, etc. As a result, the charge storage film 33 is exposed at the back surfaces of the recesses 53.

Figure 21:
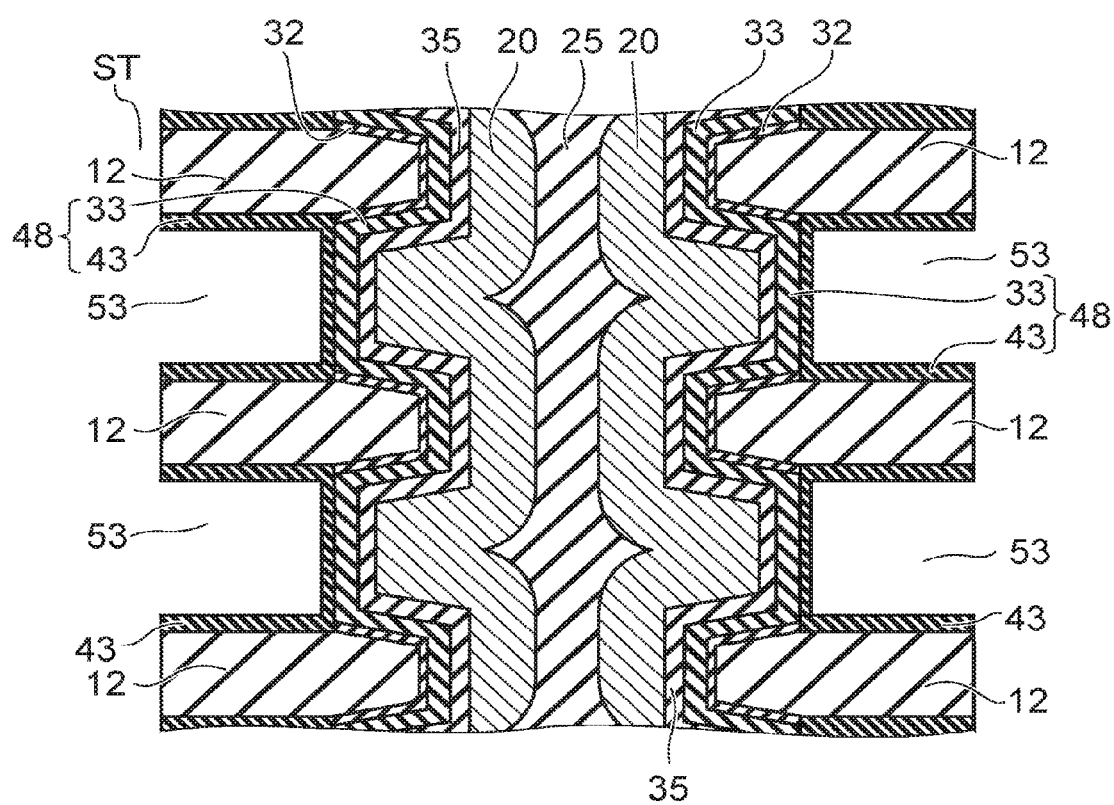

Then, as shown in FIG. 21, the charge storage film 43 is formed on the inner surfaces of the recesses 53 by depositing silicon nitride via the slit ST. The charge storage film 48 is formed of the charge storage films 33 and 43. At this time, for example, the thickness of the charge storage film 48 is set to be equal to the thickness of the charge storage film 33 of the first embodiment described above.

Figure 22:
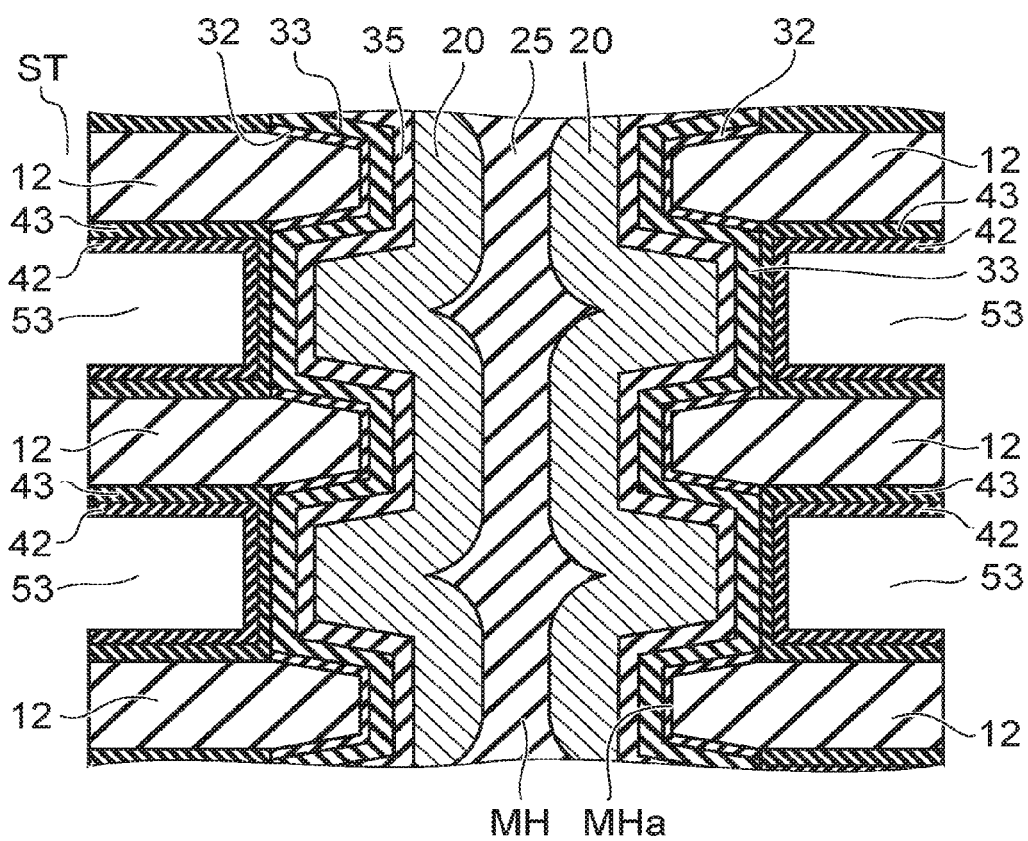

Then, as shown in FIG. 22, the silicon oxide film 42 is formed on the surface of the charge storage film 43 by depositing silicon oxide via the slit ST.

Then, as shown in FIG. 18, a high dielectric constant film 46 is formed on the surface of the silicon oxide film 42 via the slit ST. The blocking insulating film 47 is formed of the silicon oxide film 42 and the high dielectric constant film 46.

The subsequent processes are similar to those of the first embodiment described above.

Effects of the embodiment will now be described.

As described above, in the embodiment, the charge storage film that is interposed between the silicon pillar 20 and the silicon oxide films 12 is thinner than the charge storage film that is interposed between the silicon pillar 20 and the electrode films 13. Thereby, in the semiconductor memory device 3, between the memory cell transistors MC adjacent to each other in the Z-direction, the charge storage film can be set to be thin and the movement of the electrons can be suppressed while realizing the necessary programming characteristics using the charge storage film 33 and the charge storage film 43. Therefore, the retention characteristics of the data for the semiconductor memory device 3 are high.

(Fourth Embodiment)

A fourth embodiment will now be described.

Figure 23:
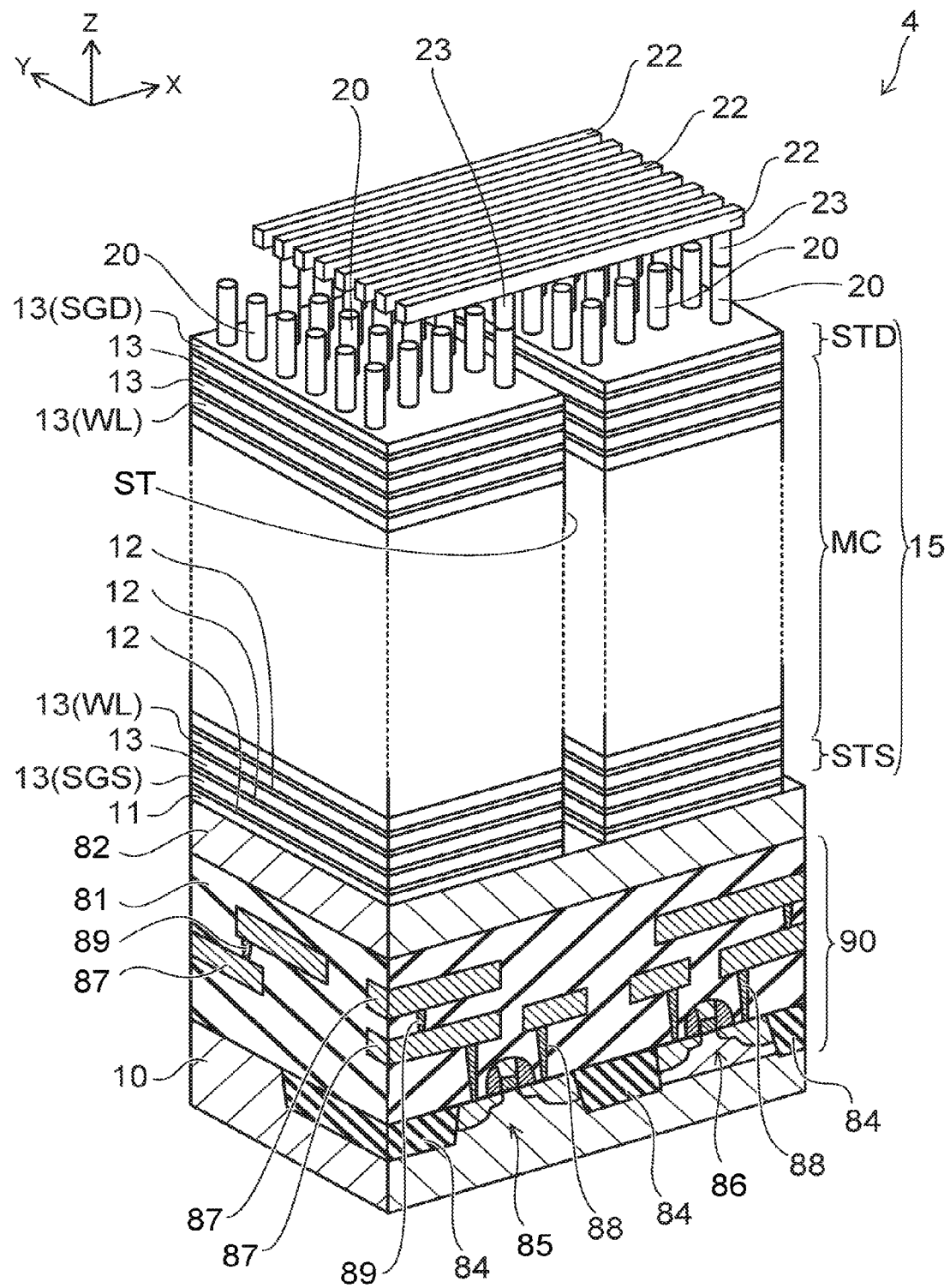
FIG. 23 is a perspective view showing a semiconductor memory device according to a fourth embodiment.

FIG. 23 is a perspective view showing a semiconductor memory device according to the embodiment.

As shown in FIG. 23, in the semiconductor memory device 4 according to the embodiment, a below-cell circuit 90 is provided below the memory cell array in addition to the configuration of the semiconductor memory device 1 according to the first embodiment described above (referring to FIG. 1).

A specific description is as follows.

In the semiconductor memory device 4, an inter-layer insulating film 81 and a source electrode film 82 are provided between the silicon substrate 10 and the stacked body 15. For example, the inter-layer insulating film 81 is formed of silicon oxide; and, for example, the source electrode film 82 is formed of polysilicon to which an impurity is added. The silicon pillar 20 is connected not to the silicon substrate 10 but to the source electrode film 82. The source electrode film 82 is insulated from the silicon substrate 10 by the inter-layer insulating film 81. Also, the source electrode film 82 is provided to be connected commonly to multiple stacked bodies and is further connected to, for example, a source line (not shown) of a lower layer.

Also, the below-cell circuit 90 is formed inside the inter-layer insulating film 81 and the upper layer portion of the silicon substrate 10. The below-cell circuit 90 is a portion of the drive circuit that performs the programming, reading, and erasing of data to and from the memory cell transistors MC and includes, for example, sense amplifiers.

For example, the upper layer portion of the silicon substrate 10 is partitioned into multiple active areas by a STI (Shallow Trench Isolation) 84; an n-type MOSFET (Metal-Oxide-Semiconductor Field-Effect Transistor) 85 is formed in one active area; and a p-type MOSFET 86 is formed in another active area. Also, multiple levels of interconnects are provided inside the inter-layer insulating film 81; contacts 88 that connect the interconnects 87 to the silicon substrate 10 are provided; and vias 89 that connect the interconnects 87 to each other are provided. The depictions of the n-type MOSFET 85, the p-type MOSFET 86, the interconnects 87, etc., in FIG. 16 are schematic and do not necessarily match the sizes and dispositions of the actual elements.

Also, the source electrode plate 17 described in reference to FIG. 1 is not provided inside the slit ST of the semiconductor memory device 4; and the source line 21 that is connected to the upper end of the source electrode plate 17 also is not provided. For example, an insulator (not shown) such as a silicon oxide plate 18 described in reference to FIG. 2 is filled into the slit ST. The potential necessary for driving is supplied from the below-cell circuit 90 to the source electrode film 82.

According to the embodiment, the space between the silicon substrate 10 and the stacked body 15 can be utilized effectively; therefore, the surface area of the circuit disposed at the periphery of the stacked body 15 can be reduced by this amount. Also, the source electrode plate 17 and the source line 21 can be omitted. As a result, even higher integration of the semiconductor memory device 4 is possible. Otherwise, the configuration, the manufacturing method, and the effects of the embodiment are similar to those of the first embodiment described above. The embodiment may be combined with the second embodiment or the third embodiment described above.

According to the embodiments described above, a semiconductor memory device having high retention characteristics of data and a method for manufacturing the semiconductor memory device can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A semiconductor memory device, comprising:
   a substrate;
   a stacked body provided on a first-direction side of the substrate, the stacked body including first insulating films and electrode films, each of the first insulating films and each of the electrode films being stacked alternately along the first direction;
   a semiconductor member extending in the first direction; and
   a charge storage film provided between the stacked body and the semiconductor member,
   a recess being made in a surface of the stacked body facing the semiconductor member every one of the electrode films,
   wherein one of the first insulating films includes a protrusion at the surface of the stacked body facing the semiconductor member, the protrusion protruding toward the semiconductor member, and a thickness of the protrusion in the first direction becomes thinner toward a tip of the protrusion.

2. The device according to claim 1, wherein the charge storage film is divided every one of electrode films in the first direction.

3. The device according to claim 1, wherein the charge storage film is formed of an insulating material.

4. The device according to claim 1, wherein the stacked body surrounds the semiconductor member.

5. The device according to claim 1, further comprising:
   a second insulating film provided between one of the electrode films and the charge storage film; and
   a third insulating film provided between the charge storage film and the semiconductor member.

6. The device according to claim 2, wherein the charge storage film is disposed to be continuous on a back surface of the recess and on surfaces respectively facing two sides of the recess in the first direction.

7. The device according to claim 3, wherein the insulating material includes silicon and nitrogen.

8. The device according to claim 7, further comprising a film disposed between one of the first insulating films and the semiconductor member, the film including silicon and oxygen.

9. A semiconductor memory device, comprising:
   a substrate;
   a stacked body provided on a first-direction side of the substrate, the stacked body including first insulating films and electrode films, each of the first insulating films and each of the electrode films being stacked alternately along the first direction;
   a semiconductor member extending in the first direction; and
   a charge storage film provided between the stacked body and the semiconductor member,
   a recess being made in a surface of the stacked body facing the semiconductor member every one of the electrode films,
   wherein an average thickness of portions of the charge storage film disposed on end surfaces of the first insulating films is thinner than an average thickness of portions of the charge storage film disposed on end surfaces of the electrode films.

10. The device according to claim 9, wherein the charge storage film includes:
    a first film provided between the stacked body and the semiconductor member; and
    a second film provided between one of the electrode films and one of the first insulating films and between the one of the electrode films and the first film.

11. A semiconductor memory device, comprising:
    a stacked body including first insulating films and electrode films, each of the first insulating films and each of the electrode films being stacked alternately along a first direction;
    a semiconductor member extending in the first direction and piercing the stacked body; and
    a charge storage film provided between the stacked body and the semiconductor member,
    a diameter of a portion of the semiconductor member surrounded with one of the electrode films being larger than a diameter of a portion of the semiconductor member surrounded with one of the first insulating films,
    wherein an average thickness of portions of the charge storage film surrounded with the first insulating films is thinner than an average thickness of portions of the charge storage film surrounded with the electrode films.

12. The device according to claim 11, wherein the charge storage film is divided by the portion surrounded with one of the first insulating films.

13. The device according to claim 11, wherein the charge storage film includes:
    a first film provided between the stacked body and the semiconductor member; and
    a second film provided between one of the electrode films and one of the first insulating films and between the one of the electrode films and the first film.

* * * * *